(12) United States Patent
Copner et al.

(10) Patent No.: US 10,056,734 B2
(45) Date of Patent: Aug. 21, 2018

(54) LASER DEVICE

(71) Applicant: RENISHAW PLC, Wotton-under-Edge, Gloucestershire (GB)

(72) Inventors: Nigel Joseph Copner, Ebbw Vale (GB); Alan James Holloway, Swindon (GB); Anas Jarjour, Edinburgh (GB); Jungang Huang, Cardiff (GB); Raymond John Chaney, Berkeley (GB)

(73) Assignee: RENISHAW PLC, Wotton-Under-Edge (GB)

( * ) Notice: Subject to any disclaimer, the term of this patent is extended or adjusted under 35 U.S.C. 154(b) by 0 days.

(21) Appl. No.: 15/312,699

(22) PCT Filed: Jun. 1, 2015

(86) PCT No.: PCT/GB2015/051581
§ 371 (c)(1),
(2) Date: Nov. 21, 2016

(87) PCT Pub. No.: WO2015/185900
PCT Pub. Date: Dec. 10, 2015

(65) Prior Publication Data
US 2017/0155229 A1    Jun. 1, 2017

(30) Foreign Application Priority Data
Jun. 5, 2014    (GB) .................................. 1410003.6

(51) Int. Cl.
*H01S 5/14*    (2006.01)
*H01S 3/08*    (2006.01)
(Continued)

(52) U.S. Cl.
CPC ............ *H01S 5/141* (2013.01); *H01S 3/0816* (2013.01); *H01S 3/08027* (2013.01); *H01S 3/1062* (2013.01); *H01S 5/02248* (2013.01)

(58) Field of Classification Search
None
See application file for complete search history.

(56) References Cited

U.S. PATENT DOCUMENTS 5,243,614 A    9/1993 Wakata et al.
5,867,512 A    2/1999 Sacher
(Continued)

FOREIGN PATENT DOCUMENTS

CN    101194402 A    6/2008
EP    0924821 A1    6/1999
(Continued)

OTHER PUBLICATIONS

Aug. 20, 2015 Search Report issued in British Patent Application No. 1410003.6.
(Continued)

*Primary Examiner* — Armando Rodriguez
(74) *Attorney, Agent, or Firm* — Oliff PLC

(57) ABSTRACT

A frequency tuneable laser device includes a cavity mode selector and a cavity tuning arrangement. The cavity mode selector has a frequency response with a selection feature that is alignable in frequency with a selected cavity mode of the laser device. The cavity tuning arrangement includes a plurality of reflective elements arranged in optical series, and is used to adjust the effective optical path length of the laser cavity to move the cavity modes in frequency. The laser device further includes making the cavity mode selector and the cavity tuning arrangement perform a simultaneous coordinated movement such that respective frequencies of the selection feature and the selected cavity mode vary with
(Continued)

substantially the same dependence on a parameter characterizing the simultaneous coordinated movement. For example, a periscope with a co-rotating etalon can be used to provide mode hop free tuning of the laser device.

27 Claims, 12 Drawing Sheets

(51) Int. Cl.
    *H01S 3/081*     (2006.01)
    *H01S 3/106*     (2006.01)
    *H01S 5/022*     (2006.01)

(56) References Cited

U.S. PATENT DOCUMENTS

| | | | |
|---|---|---|---|
| 5,956,355 | A | 9/1999 | Swanson et al. |
| 6,038,239 | A | 3/2000 | Gabbert |
| 6,049,554 | A | 4/2000 | Lang et al. |
| 6,463,085 | B1 | 10/2002 | Tayebati |
| 6,526,071 | B1 | 2/2003 | Zorabedian et al. |
| 6,822,979 | B2 * | 11/2004 | Daiber .................... H01S 5/141 372/18 |
| 6,940,879 | B2 | 9/2005 | Zhang |
| 6,967,976 | B2 | 11/2005 | Xie et al. |
| 7,099,358 | B1 | 8/2006 | Chong |
| 8,514,898 | B1 | 8/2013 | Pang |
| 2002/0136104 | A1 | 9/2002 | Daiber |
| 2003/0012250 | A1 | 1/2003 | Shirasaki |
| 2003/0022414 | A1 | 1/2003 | Lian et al. |
| 2004/0109487 | A1 | 6/2004 | Zhang |
| 2005/0008045 | A1 | 1/2005 | Xie et al. |
| 2005/0078906 | A1 | 4/2005 | Lunt et al. |
| 2005/0105565 | A1 | 5/2005 | Tobiason et al. |
| 2006/0109872 | A1 | 5/2006 | Sanders |
| 2006/0203859 | A1 | 9/2006 | Cable et al. |

FOREIGN PATENT DOCUMENTS

| | | |
|---|---|---|
| JP | H01-233785 A | 9/1989 |
| JP | H07-43243 U | 8/1995 |
| JP | H10-133243 A | 5/1998 |
| JP | H11-293202 A | 10/1999 |
| JP | 2002-164614 A | 6/2002 |
| JP | 2006-024876 A | 1/2006 |
| JP | 2006-080384 A | 3/2006 |
| JP | 2007-027306 A | 2/2007 |
| JP | 2008-071798 A | 3/2008 |
| JP | 2008-130805 A | 6/2008 |
| WO | 01/73905 A1 | 10/2001 |
| WO | 03/005503 A2 | 1/2003 |
| WO | 2006/079100 A2 | 7/2006 |
| WO | 2009/081160 A1 | 7/2009 |
| WO | 2010/070272 A1 | 6/2010 |

OTHER PUBLICATIONS

Oct. 16, 2015 International Search Report issued in International Patent Application No. PCT/GB2015/051581.
Do-Kyeong Ko et al; "Accurate frequency-tuning mechanism from a wedge prism in a single-mode tunable laser;" Applied Optics; Feb. 20, 1995; vol. 34; No. 6; pp. 983-987.
Oct. 16, 2015 Written Opinion issued in International Patent Application No. PCT/GB2015/051581.
Jun. 13, 2018 Examination Report issued in European Patent Application No. 15 726 274.2.

* cited by examiner

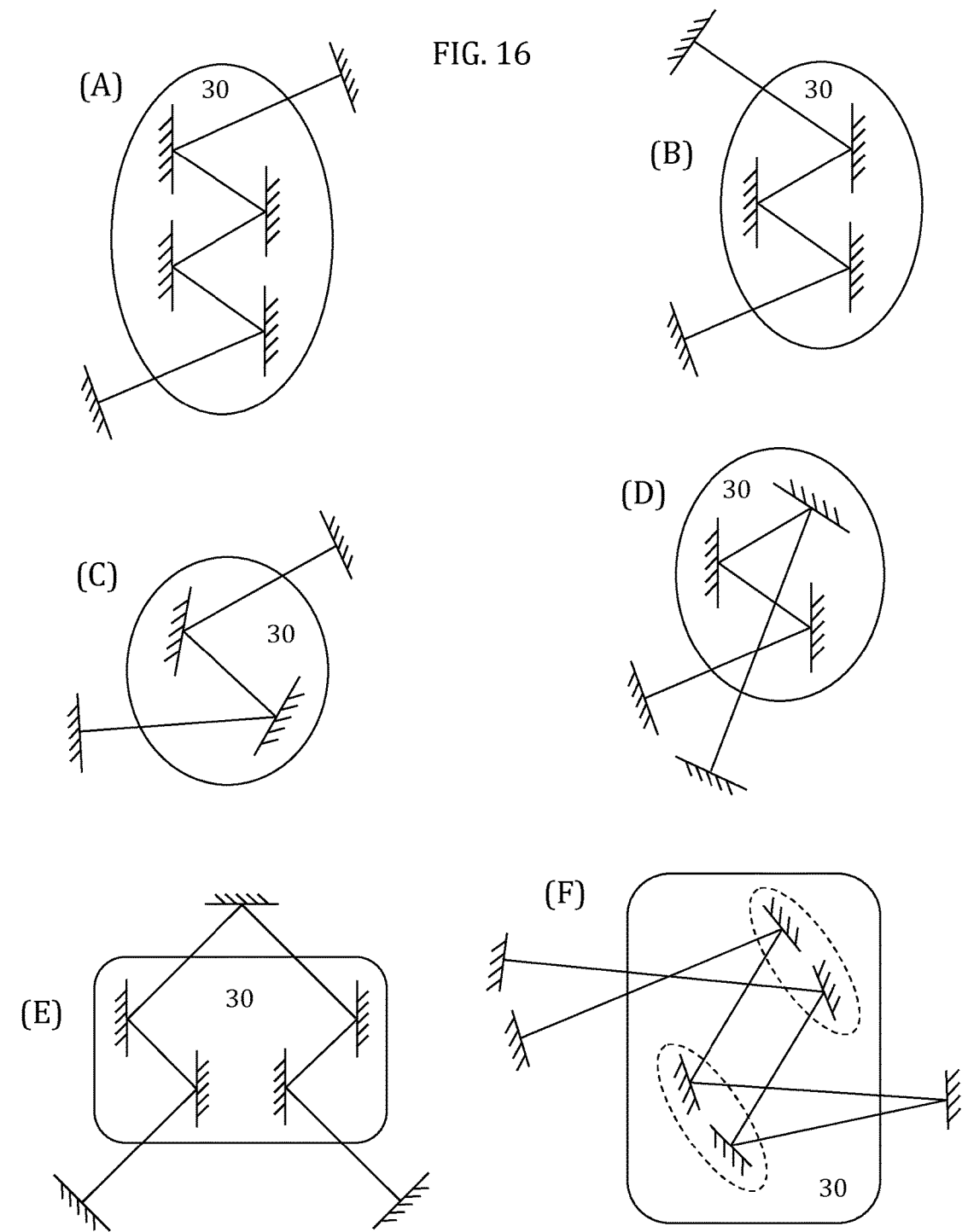

LASER DEVICE

The present invention relates to a frequency controllable laser device. In particular, the invention relates to a frequency controllable laser device that is capable of being modulated or chirped at a high frequency.

Frequency chirped laser devices, for use in interferometry and the like, are known. In particular, it is known to provide laser devices that implement a so-called Littrow scheme in which the laser cavity includes a diffraction grating onto which collimated light is directed. Tilting of the diffraction grating permits the frequency and cavity length of the laser to be simultaneously altered to provide the required frequency tuning without mode hopping. However, the Littrow arrangement has the disadvantage that the diffraction grating must be rotated about a well defined pivot point. The critically stable mechanical arrangement required to provide the necessary accuracy of grating motion thus makes it difficult to obtain high frequency modulation speeds.

This issue was addressed in WO 2009/081160 and WO 2010/070272. In particular, WO 2009/081160 describes a frequency tuneable external cavity laser device comprising a laser source for generating a beam of light, a spectral tuning element and one or more further optical components for directing the beam of light on to the spectral tuning element. An optical component forming part of the laser cavity of the laser device is moveable in a first degree of freedom such that movement of the moveable optical component in the first degree of freedom simultaneously alters the effective optical path length of the laser cavity and the tuning frequency of the spectral tuning element thereby providing frequency tuning in which mode hopping is suppressed. Furthermore, the effective optical path length and the tuning frequency are substantially insensitive to any movement of the moveable optical component in degrees of freedom other than the first degree of freedom.

It is desirable to provide further improvements to frequency tuneable laser devices such as those described in WO 2009/081160 and WO 2010/070272.

According to a first aspect of the present invention, there is provided a frequency tuneable laser device comprising a laser cavity defining a plurality of cavity modes at which the laser device is capable of lasing. Each cavity mode has a different respective mode frequency. The laser cavity comprises a cavity mode selector having a frequency response with a selection feature that is alignable in frequency with a cavity mode of the plurality to encourage that cavity mode to lase in preference to others. That cavity mode is denoted as the "selected cavity mode". The cavity mode selector is configured so that a frequency of the selection feature is selectively adjustable by a predetermined movement of the cavity mode selector, such as a rotation about a particular degree of freedom. The laser cavity also comprises a cavity tuning arrangement for adjusting the effective optical path length of the laser cavity to move the cavity modes in frequency. The cavity tuning arrangement comprises a plurality of reflective elements arranged in optical series. A frequency of the selected cavity mode is selectively adjustable by a predetermined movement of the cavity tuning arrangement, such as a rotation about a particular degree of freedom (e.g. the same degree of freedom mentioned above in respect of the cavity mode selector). The laser device further comprises an actuator configured to make (or means for making) the cavity mode selector and the cavity tuning arrangement perform a simultaneous coordinated movement, with respective frequencies of the selection feature and the selected cavity mode varying as a result of the simultaneous coordinated movement with substantially the same dependence on a parameter characterising the simultaneous coordinated movement, at least over a predetermined range of the parameter.

With such an arrangement, frequency tuning of the laser device can be provided in which hopping between the cavity modes (i.e. mode hopping) is prevented (i.e. single mode tuning is achieved), over at least the predetermined parameter range.

An embodiment of the present invention provides a rapidly tuneable narrow line width laser device.

The cavity mode selector may be separate from the cavity tuning arrangement. In other words, the cavity mode selector may be formed from different optical components to the cavity tuning arrangement.

Those parts of the cavity mode selector that contribute to the frequency response of the cavity mode selector (with the selection feature) may be separate from those parts of the cavity tuning arrangement that contribute to the adjusting of the effective optical path length of the laser cavity to move the cavity modes in frequency.

The frequency response of the cavity mode selector may have a plurality of such selection features, each of which could potentially encourage a cavity mode to lase in preference to others, and only one of which selection features is aligned in frequency with the selected cavity mode. The laser device may further comprise a filter element which has a frequency response that (a) has a filter feature that is alignable in frequency with the selection feature of the cavity mode selector that is aligned with the selected cavity mode and (b) combines with the frequency response of the cavity mode selector to produce a combined frequency response that encourages the selected cavity mode to lase in preference to others. The actuator may be configured to make the filter element, the cavity mode selector and the cavity tuning arrangement perform a simultaneous coordinated movement, with respective frequencies of the aligned selection feature, the filter feature and the selected cavity mode varying with substantially the same dependence on the parameter characterising the simultaneous coordinated movement, at least over the predetermined range of the parameter.

According to a further aspect of the present invention there is provided a frequency tuneable laser device comprising a laser cavity defining a plurality of cavity modes at which the laser device is capable of lasing. Each cavity mode has a different respective mode frequency. The laser cavity comprises a cavity mode selector having a frequency response with a selection feature that is alignable in frequency with a cavity mode of the plurality to encourage that cavity mode, denoted as the selected cavity mode, to lase in preference to others, with a frequency of the selection feature being selectively adjustable by a predetermined movement of the cavity mode selector. The frequency response of the cavity mode selector has a plurality of such selection features, each of which could potentially encourage a cavity mode to lase in preference to others, and only one of which selection features is aligned in frequency with the selected cavity mode. The laser device further comprises a filter element which has a frequency response that (a) has a filter feature that is alignable in frequency with the selection feature of the cavity mode selector that is aligned with the selected cavity mode and (b) combines with the frequency response of the cavity mode selector to produce a combined frequency response that encourages the selected cavity mode to lase in preference to others. The laser device further comprises an actuator configured to make (or means for making) the cavity mode selector and the filter element perform a simultaneous coordinated movement, with respective frequencies of the aligned selection feature and the filter feature varying as a result with substantially the same dependence on a parameter characterising the simultaneous coordinated movement, at least over a predetermined range of the parameter.

The filter element may be formed from a plurality of etalons arranged in series with each etalon of the plurality having a different etalon mode spacing.

The parts performing the simultaneous coordinated movement may be mechanically coupled to one another by a coupling which maintains the parts in a fixed relationship relative to one another, with the actuator being configured to move the coupled parts together as a group.

The simultaneous coordinated movement may be a relative rotational movement of each of the parts performing the simultaneous coordinated movement. The parameter characterising the simultaneous coordinated movement may be a rotational angle associated with the relative rotational movement.

The simultaneous coordinated movement may be a relative rotational movement of each of the parts performing the simultaneous coordinated movement by the same amount.

The dependence may be an inverse cosine dependence on the rotational angle.

The cavity mode selector may comprise a diffraction grating.

The cavity mode selector may comprise an etalon having opposed partially reflective surfaces defining a plurality of etalon modes, with the or each selection feature being or relating to a respective etalon mode.

The cavity mode selector and the filter element may share an etalon in common.

A medium provided in a space between the reflective elements of the cavity tuning arrangement may have substantially the same refractive index as a medium provided in a space between the reflective surfaces of the cavity mode selector etalon.

The laser device may comprise first and second arrangements of reflective elements, with the reflective elements of the first and second arrangements defining the laser cavity of the laser device, and the reflective elements of the second arrangement being the reflective elements of the cavity tuning arrangement.

The reflective elements of the first arrangement may be arranged to define an optical path for the laser cavity which passes at least twice in each direction through the series of reflective elements of the cavity tuning arrangement before returning to the same reflective element of the first arrangement.

The cavity tuning arrangement may comprise an even number of reflective elements.

The plurality of reflective elements of the cavity tuning arrangement being arranged in optical series can be considered as each reflective element in the series being arranged to direct light towards the next reflective element in the series, if any.

The cavity tuning arrangement may be formed of a material substrate with the reflective elements of the cavity tuning arrangement being formed on or by the surface of the material substrate.

The laser device may be an external cavity laser device, with the laser cavity of the laser device being an external laser cavity.

The predetermined movement of the cavity tuning arrangement may be a movement of the cavity tuning arrangement as a whole, i.e. such that all reflective elements of the cavity tuning arrangement move together as a group or unit.

According to a further aspect of the present invention there is provided a frequency tuneable laser device comprising first and second arrangements of reflective elements. The reflective elements of the first and second arrangements define a laser cavity of the laser device. The laser cavity provides a plurality of cavity modes at which the laser device is capable of lasing. Each cavity mode has a different respective mode frequency. The reflective elements of the second arrangement provide a cavity tuning arrangement for adjusting the effective optical path length of the laser cavity to move the cavity modes in frequency. The reflective elements of the cavity tuning arrangement are arranged in optical series. The effective optical path length of the laser cavity is selectively adjustable by a predetermined movement of the cavity tuning arrangement, such as a rotation about a particular degree of freedom. The reflective elements of the first arrangement are arranged to define an optical path for the laser cavity which passes at least twice in each direction through the series of reflective elements of the cavity tuning arrangement before returning to the same reflective element of the first arrangement.

This applies at least in respect of a reflective element of the first arrangement that performs the function of an end reflector for the laser cavity, for example a reflective element associated with the laser source.

The reflective elements of the first arrangement may be arranged to define an optical path for the laser cavity which passes at least an even number of times in each direction through the series of reflective elements of the cavity tuning arrangement before returning to the same reflective element of the first arrangement.

The first arrangement may comprise an odd number of reflective elements.

At least one of the reflective elements of the first arrangement may be a retro-reflective component.

At least one of the reflective elements of the first arrangement may be a lateral displacement component, such as a roof prism.

A separation between a pair of reflective elements of the first arrangement may be arranged to be smaller than twice a separation between a pair of reflective elements of the cavity tuning arrangement, more preferably smaller than the separation between the pair of reflective elements of the cavity tuning arrangement, more preferably smaller than half the separation between the pair of reflective elements of the cavity tuning arrangement, more preferably smaller than a quarter of the separation between the pair of reflective elements of the cavity tuning arrangement, more preferably smaller than a tenth of the separation between the pair of reflective elements of the cavity tuning arrangement.

The pair of reflective elements of the first arrangement may form the end mirrors of the laser device.

At least two of the reflective elements of the cavity tuning arrangement may be substantially parallel with one another.

The cavity tuning arrangement may comprise an even number of reflective elements.

According to a further aspect of the present invention there is provided an optical device comprising first and second arrangements of reflective elements. The reflective elements of the first and second arrangements define an optical cavity (or optical resonator or resonator cavity) of the optical device. The optical cavity provides a plurality of cavity modes (or resonator modes or resonant modes), with each cavity mode having a different respective mode frequency. The reflective elements of the second arrangement provide a cavity tuning arrangement for adjusting the effective optical path length of the optical cavity to move the cavity modes in frequency. The reflective elements of the cavity tuning arrangement are arranged in optical series. The effective optical path length of the optical cavity is selectively adjustable by a predetermined movement of the cavity tuning arrangement, such as a rotation about a particular degree of freedom. The reflective elements of the first arrangement are arranged to define an optical path for the optical cavity which passes at least twice in each direction through the series of reflective elements of the cavity tuning arrangement before returning to the same reflective element of the first arrangement. At least one of the reflective elements of the first arrangement may be or comprise a retro-reflective reflector.

According to a further aspect of the present invention there is provided a laser device comprising a filter formed from a plurality of etalons arranged in series, with each etalon of the plurality having a different etalon mode spacing. The etalons of the plurality are preferably passive etalons.

According to a further aspect of the present invention there is provided an external cavity laser device comprising an arrangement of reflective elements defining a laser cavity of the laser device, the laser cavity providing a plurality of cavity modes at which the laser device is capable of lasing, with each cavity mode having a different respective mode frequency, wherein at least one of the reflective elements is a retro-reflective component.

According to a further aspect of the present invention there is provided an external cavity laser device comprising an arrangement of reflective elements defining a laser cavity of the laser device, the laser cavity providing a plurality of cavity modes at which the laser device is capable of lasing, with each cavity mode having a different respective mode frequency, wherein at least one of the reflective elements is a lateral displacement component, such as a roof prism.

According to an aspect of the present invention there is provided a frequency tuneable laser device comprising a cavity mode selector and a cavity tuning arrangement. The cavity mode selector has a frequency response with a selection feature that is alignable in frequency with a selected cavity mode of the laser device. The cavity tuning arrangement comprises a plurality of reflective elements arranged in optical series, and is used to adjust the effective optical path length of the laser cavity to move the cavity modes in frequency. The laser device further comprises means for making the cavity mode selector and the cavity tuning arrangement perform a simultaneous coordinated movement such that respective frequencies of the selection feature and the selected cavity mode vary with substantially the same dependence on a parameter characterising the simultaneous coordinated movement. For example, a periscope with a co-rotating etalon can be used to provide mode hop free tuning of the laser device, particularly where the periscope is configured to give a predominantly cosine tuning response.

According to an aspect of the present invention there is provided a frequency tuneable laser device comprising a cavity mode selector and a filter element. The cavity mode selector has a frequency response with a plurality of selection features, one of which is aligned in frequency with a selected cavity mode of the laser device. The filter element has a frequency response that (a) has a filter feature that is alignable in frequency with the selection feature of the cavity mode selector that is aligned with the selected cavity mode and (b) combines with the frequency response of the cavity mode selector to produce a combined frequency response that encourages the selected cavity mode to lase in preference to others. The laser device further comprises means for making the cavity mode selector and the filter element perform a simultaneous coordinated movement such that respective frequencies of the aligned selection feature and the filter feature vary with substantially the same dependence on a parameter characterising the simultaneous coordinated movement. For example, a co-rotating filter and etalon can be used to enhance mode hop free tuning of the laser device.

According to an aspect of the present invention there is provided an optical device comprising first and second arrangements of reflective elements defining an optical cavity of the optical device, with the optical cavity providing a plurality of cavity modes. The reflective elements of the second arrangement, which are arranged in optical series, provide a cavity tuning arrangement for adjusting the effective optical path length of the optical cavity to move the cavity modes in frequency. The effective optical path length of the optical cavity is selectively adjustable by a predetermined movement of the cavity tuning arrangement. The reflective elements of the first arrangement are arranged to define an optical path for the optical cavity which passes at least twice in each direction through the series of reflective elements of the cavity tuning arrangement before returning to the same reflective element of the first arrangement. The optical device may be a frequency tuneable laser device, with the optical cavity being a laser cavity of the laser device. For example, double passing can be used as a means to stabilise against end mirror angular drift.

According to an aspect of the present invention there is provided a laser device comprising a filter formed from a plurality of etalons arranged in series, with each etalon of the plurality having a different respective etalon mode spacing. For example, pairs or groups of etalons can be used as an alternative to a multi-layer filter for etalon side-mode suppression.

According to an aspect of the present invention there is provided an external cavity laser device comprising an arrangement of reflective elements defining a laser cavity of the laser device, wherein at least one of the reflective elements is a retro-reflective or lateral displacement component.

According to an aspect of the present invention there is provided a mechanism (such as reflection and/or transmission from an optical component) for monitoring the alignment of the lasing cavity mode with the selection feature of the cavity mode selector and combining this monitoring with an adjustment mechanism to maintain their relative alignment. The adjustment mechanism may be the diode drive current, and/or the diode temperature, and/or the temperature of at least one element in the cavity, and/or rotation/translation of the various tuning parts/optical elements in the cavity.

It is to be noted that all subsidiary statements written under any aspect of the present invention defined above apply equally to the other aspects of the present invention, where appropriate.

Reference will now be made, by way of example, to the accompanying drawings, in which:

FIG. 16 illustrates a number of alternative periscope arrangements to that illustrated in FIG. 11.

Figure 1:
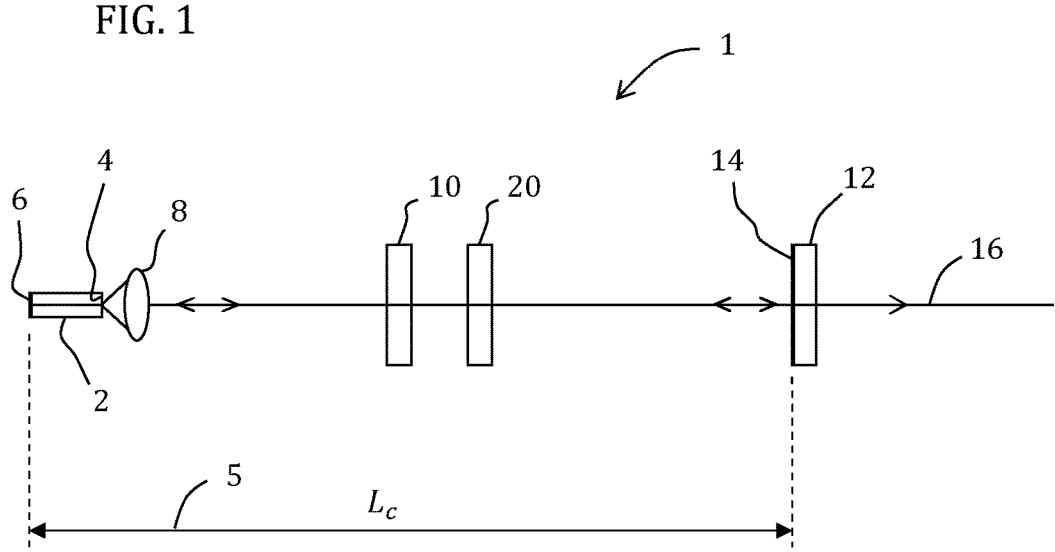
FIG. 1 is a schematic diagram of laser device for use in explaining an embodiment of the present invention.

Before describing an embodiment of the invention in detail, the background and theory underlying tuneable narrow line width laser devices will first be explored with reference to FIG. 1.

FIG. 1 illustrates a tuneable external cavity laser device 1 comprising an optical gain medium 2 (e.g. formed by a semiconductor diode) having a front face 4 with an anti-reflective coating and a rear face 6 with a reflective coating. A coupling lens 8 arranged in front of the optical gain medium 2 couples light into and out of the optical gain medium 2. A light-transmissive optical element 12 with a partially reflective coating on its front face 14 is arranged to form a resonant external laser cavity 5, with the length of the laser cavity 5 being defined by the distance $L_c$ between the rear face 6 of the optical gain medium 2 and the front face 14 of the optical element 12. Since the coating on the front face 14 of the optical element 12 is partially transmissive, some light from the laser cavity 5 passes through the optical element 12 to form an output 16 from the laser device 1.

Of course, other external cavity laser device arrangements are possible. For example, the output 16 from the laser device 1 could instead be taken from the rear of the optical gain medium 2 by having a partially reflective coating on the rear face 6 of the optical gain medium 2 and a fully reflective coating on the front face 14 of the optical element 12. Alternatively, light may be extracted from the laser device 1 by including a beam splitter component (not shown). Other arrangements would be readily apparent to the skilled person.

The laser device 1 also comprises a spectral tuning element in the form of an etalon 10, and a filter 20, which are arranged in the path of the laser light within the laser cavity 5. The effect of the etalon 10 and the filter 20 will be described in more detail below. As also explained below, the etalon 10 is also referred to herein as a cavity mode selector.

Figure 2:
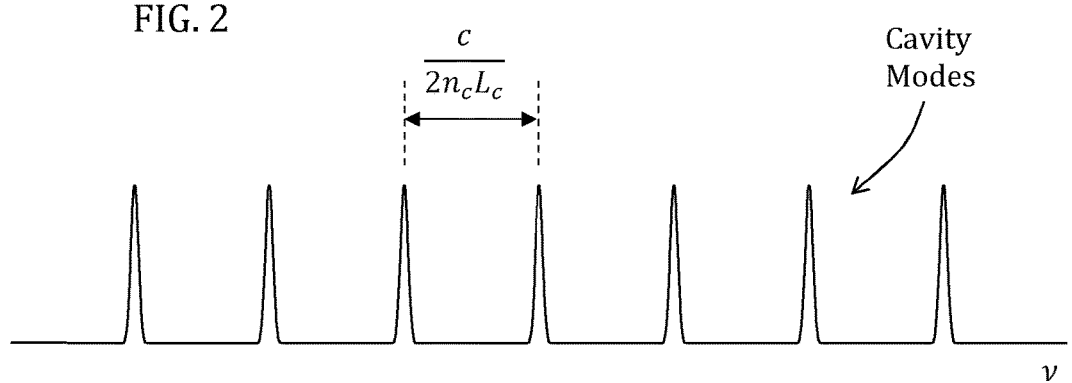
FIG. 2 is a schematic illustration of a plurality of discrete laser cavity modes associated with the laser device of FIG. 1.

Ignoring the effect of the etalon 10 and the filter 20 for now, the laser cavity 5 gives rise to a plurality of discrete cavity modes as illustrated schematically in FIG. 2, each having (being centred on) a different frequency. The cavity modes are defined by the full round optical path length $2n_c L_c$ within the cavity length being equal to an integer number of vacuum wavelengths:

$$2n_c L_c = m_c \lambda_0$$

where:
$L_c$ is the cavity length
$\lambda_0$ is the wavelength in a vacuum
$n_c$ is the optical refractive index in the cavity
$m_c$ is an integer The above expression, which can be considered to be the optical path difference $\Delta$ between consecutive passes of the laser cavity, can be written in terms of vacuum frequency $v_0$ rather than vacuum wavelength $\lambda_0$ by using:

$$c = \lambda_0 v_0$$
$$\lambda_0 = \frac{c}{v_0} = \frac{c}{v_c}$$

where c is the speed of light in a vacuum and $v_c$ is the cavity mode frequency (which is the same as the vacuum frequency $v_0$).

This gives:

$$2n_c L_c = m_c \frac{c}{v_c}$$

This above expression can be rearranged to provide an expression for the cavity mode frequency $v_c$:

$$v_c = m_c \frac{c}{2n_c L_c}$$

The frequency spacing between adjacent cavity modes is therefore:

$$\frac{c}{2n_c L_c}$$

This frequency spacing is marked on FIG. 2. The discrete cavity modes illustrated in FIG. 2 define the possible operating frequencies of the laser device, since the laser can only lase at those discrete frequencies. To ensure single mode operation, it is necessary to advantage just one of those cavity modes.

Figure 3:
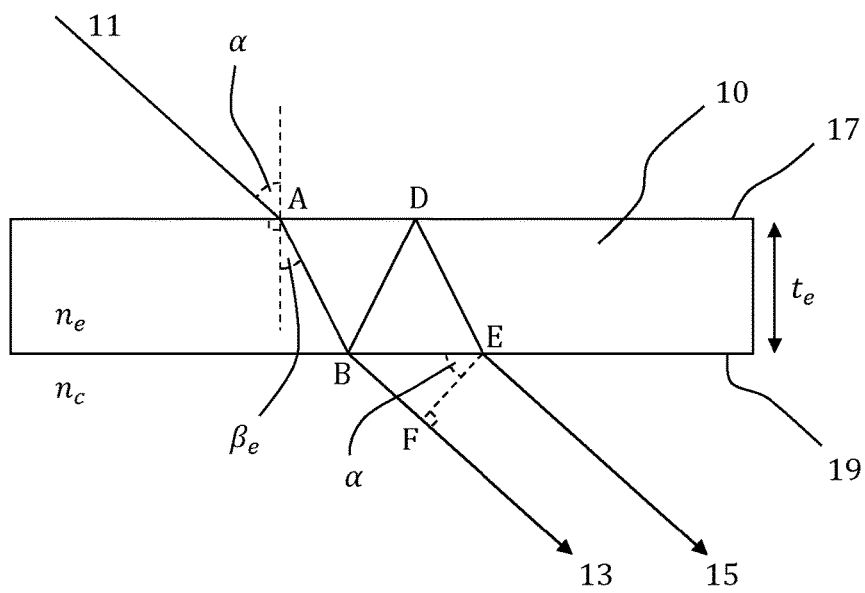
FIG. 3 is a schematic illustration of an etalon used in an embodiment of the present invention as a cavity mode selector, with annotations which are used in a derivation of the etalon modes of the etalon.

One way to advantage a single cavity mode is to include the etalon 10 in the laser cavity 5. As illustrated in FIG. 3, the etalon 10 is formed by two partially reflective surfaces 17, 19 that are substantially parallel to one another, with perpendicular separation of $t_e$. A ray of light 11 is incident on the etalon 10 at an angle α relative to the surface normal, while the optical path within the etalon 10 is at an angle $β_e$ relative to the surface normal.

Referring to the points A, B, D, E and F marked on FIG. 3, the optical path difference Δ between consecutive passes of the etalon 10 (i.e. the optical path difference between rays 13 and 15) is given by:

$$\Delta = (BD + DE)n_e - (BF)n_c$$
$$= 2(DE)n_e - (BF)n_c$$

where $n_e$ is the optical refractive index in etalon 10. From basic trigonometry it is known that:

$$BF = BE \sin\alpha$$

and also that:

$$BE = 2DE \sin\beta_e$$

So that:

$$BF = 2DE \sin\beta_e \sin\alpha$$

Putting this back into the expression for Δ, the following is obtained:

$$\Delta = 2DE(n_e - n_c \sin\beta_e \sin\alpha)$$

Again from basic trigonometry it is known that:

$$DE = \frac{t_e}{\cos\beta_e}$$

It is also known from Snell's law that:

$$\sin\alpha = \frac{n_e}{n_c}\sin\beta_e$$

This therefore gives:

$$\Delta = 2\frac{t_e}{\cos\beta_e}(n_e - n_e\sin^2\beta_e)$$
$$= \frac{2n_e t_e}{\cos\beta_e}(1 - \sin^2\beta_e)$$
$$= 2n_e t_e \cos\beta_e$$

The etalon modes are defined by the optical path difference Δ between consecutive passes of the etalon 10 being equal to an integer number of vacuum wavelengths (similar to the definition of the cavity modes above):

$$2n_e t_e \cos\beta_e = m_e \lambda_0$$

where:
$m_e$ is an integer
$\lambda_0$ is the wavelength in a vacuum

Again, the above expression can be written in terms of frequency $\nu_0$ rather than wavelength $\lambda_0$ by using:

$$c = \lambda_0 \nu_0 = \lambda_0 \nu_e$$

where $\nu_e$ is the etalon mode frequency (which is the same as the vacuum frequency $\nu_0$).

This gives the following expression for the etalon mode frequency $\nu_e$:

$$\nu_e = m_e \frac{c}{2n_e t_e \cos\beta_e}$$

Compare this to the expression for the cavity mode frequency $\nu_c$ derived above:

$$\nu_c = m_c \frac{c}{2n_c L_c}$$

The etalon expression can be placed in an analogous form by considering the "etalon length" $L_e$, which is not fixed but which varies according to the following expression:

$$L_e = t_e \cos\beta_e$$

So that:

$$\nu_e = m_e \frac{c}{2n_e L_e}$$

Figure 4:
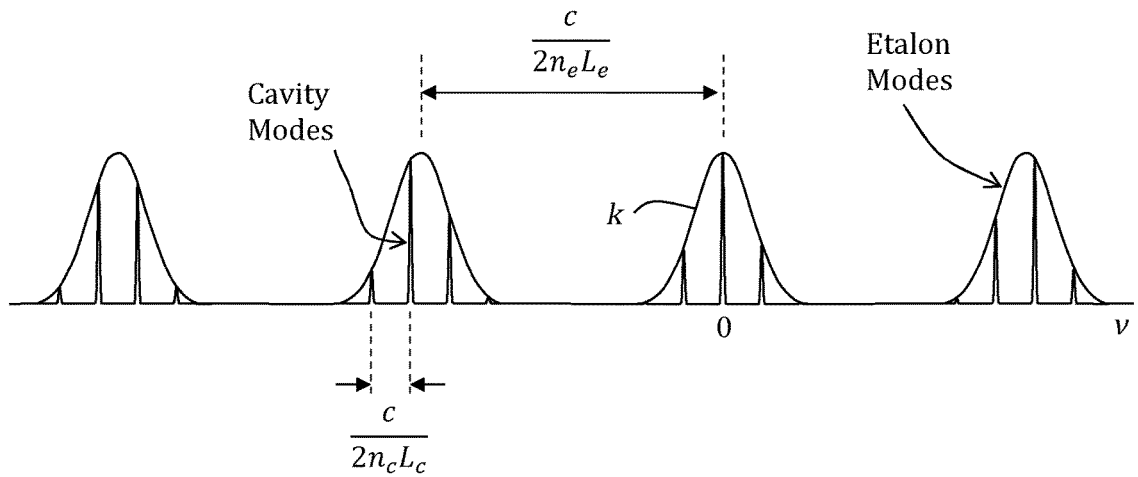
FIG. 4 is a schematic illustration of a plurality of modes (selection features) of the cavity mode selector of FIG. 3 combined with the laser cavity modes of FIG. 2.

By making $L_e \ll L_c$, the etalon mode separation becomes much larger than the cavity mode separation, and the combined cavity and etalon gain appears as illustrated schematically in FIG. 4.

As is shown in FIG. 4, the etalon gain (or frequency response) is effectively superimposed on the cavity gain, such that the etalon gain acts in a periodic fashion to suppress cavity modes according to the envelope of the etalon gain function. Since the cavity mode marked as '0' in FIG. 4 is best aligned with a peak in the etalon mode gain (the other etalon mode peaks are slightly offset from a cavity mode), that cavity mode is encouraged to lase in preference to other cavity modes since it has the largest gain.

In theory, therefore, a laser set up according to FIG. 4 will run single mode at the frequency of cavity mode '0'. The etalon 10 is acting to pick out or select a particular cavity mode to be the dominant mode. In other words, the etalon 10 is performing the function of a cavity mode selector having a frequency response with a selection feature (etalon mode 'k') that is alignable in frequency with a particular cavity mode of the plurality (cavity mode '0') to encourage that cavity mode to lase in preference to others. What is more, the frequency of the selection feature (etalon mode 'k') is selectively adjustable by a rotation of the etalon 10.

However, it can be seen from FIG. 4 that neighbouring etalon modes to the etalon mode 'k' encompassing cavity mode '0' have cavity modes that are very close to an etalon mode gain peak. It can therefore be understood that the dominant laser mode will be very sensitive to slight drifts in one or both of the etalon and cavity lengths, which can result in undesirable mode hopping. In this respect, mode hopping is when the laser jumps or 'hops' between cavity modes, so that the output light also hops undesirably between different frequencies.

Therefore, since the placement of the etalon modes relative to the cavity modes cannot be perfectly guaranteed, a broadband (single peak) filter can be used in addition to the etalon 10 to provide more certain suppression of all but one of the etalon modes.

Figure 5:
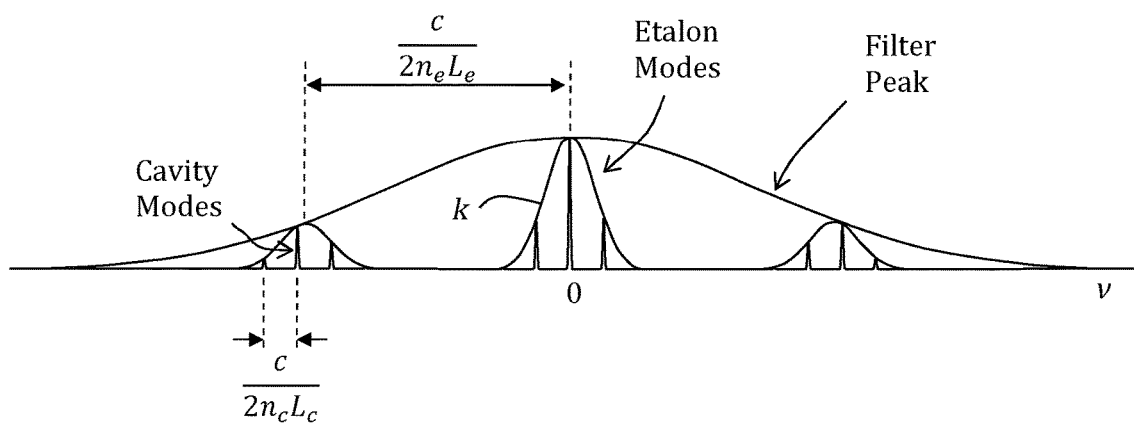
FIG. 5 is a schematic illustration of the effect of a filter (and/or absorption band of the gain medium) on the combined etalon modes and cavity mode response of FIG. 4.

The net cavity gain for the laser device 1 with the broadband filter 20 in place is illustrated schematically in FIG. 5, with the filter peak being aligned with cavity mode '0'. With the additional suppression provided by the broadband filter 20, the laser device 1 will now more reliably run single mode at the frequency of cavity mode '0', even with slight misplacements of the etalon 10 or filter 20 gains (particular the filter 20 gain). (The natural gain profile of the laser medium does also in effect act as a natural broadband filter, and that may be sufficient in some applications.)

The laser device 1 is also single mode tuneable (i.e. tuneable without hopping to another mode) if cavity mode '0' and etalon mode 'k' can be made to move along the frequency axis v in a sufficiently synchronised fashion. In this context, "sufficiently synchronised" can be understood to be an introduction (due to the tuning) of a frequency difference between the cavity and etalon modes which is less than, or small compared to, half the cavity mode spacing, i.e:

$$\frac{1}{2}\frac{c}{2n_c L_c}$$

For a tuning range of less than plus or minus half the etalon mode spacing, i.e. less than:

$$\pm\frac{1}{2}\frac{c}{2n_e L_e}$$

the broadband filter 20 could be stationary. For a wider tuning range the filter peak should also adequately synchronise with the etalon mode motion. Adequately synchronised in this sense can be understood to be an introduction (due to the tuning) of a frequency difference between the filter peak and the etalon modes which is less than, or small compared to, half the etalon mode spacing, i.e:

$$\frac{1}{2}\frac{c}{2n_e L_e}$$

From the above discussion relating to FIG. 3, it is apparent that the etalon modes can be moved along the frequency axis by changing the angle of incidence α (and hence the internal angle $\beta_e$). An expression for the etalon mode frequencies $v_e$ is derived above, and copied below:

$$v_e = m_e \frac{c}{2n_e l_e \cos\beta_e}$$

Now, the peak frequency $v_f$ of a broadband multi-layer filter is known to move along the frequency axis roughly as:

$$v_f \propto \frac{1}{\cos\beta_f}$$

where $\beta_f$ is the effective optical path angle within the filter 20.

Based on the above careful analysis, the present applicant has appreciated that, due to the inverse cosine dependence of both the etalon mode frequency and the filter peak on optical path angle β, an effective tuning arrangement for a tuneable laser device would be achieved by rotation of the etalon 10 and co-rotation of the broadband filter 20 with the etalon 10. It is to be emphasised that reference herein to an "inverse cosine dependence" is a reference to a multiplicative inverse (i.e. the reciprocal of the cosine) rather than a functional inverse (i.e. arccos).

The present applicant has also appreciated from the above analysis that, in order to ensure that the cavity modes also move in synchronisation with the etalon modes and the filter peak, it is ideally required that the cavity modes are also made to vary somehow with the same inverse cosine rotational dependence as the etalon 10 and the filter 20.

Figure 6:
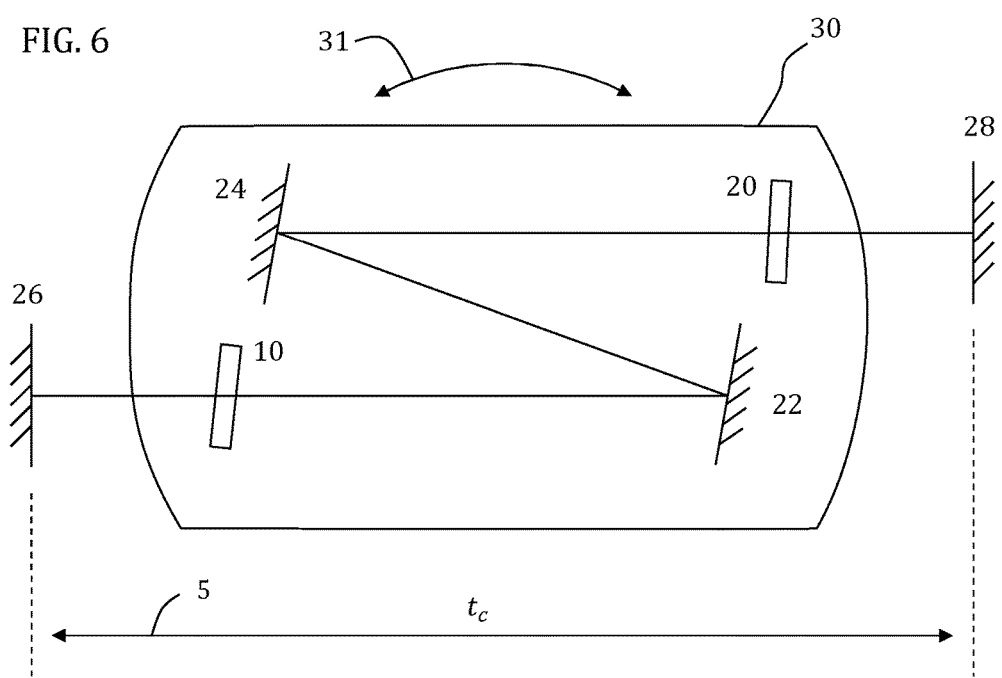
FIG. 6 is a schematic illustration of a periscope arrangement used in an embodiment of the present invention as a cavity tuning arrangement.

The present applicant proposes that this can be achieved by an arrangement illustrated in FIG. 6, with the etalon 10 and filter 20 being carried by a rotatable unit 30 arranged between a first fixed end mirror 26 and a second fixed end mirror 28 arranged substantially parallel to the first fixed end mirror 26.

As will be seen further below, the external mirrors 26 and 28 correspond respectively to the reflective surfaces 6 and 14 of the laser device 1 illustrated in FIG. 1. However, the cavity length is written as $t_c$ in FIG. 6 rather than $L_c$ because $t_c$ is a fixed distance whereas the effective laser cavity length $L_c$ will vary depending on the rotational angle of the rotatable unit 30; this will become apparent below.

The rotatable unit 30 also carries a first internal mirror 22 and a second internal mirror 24 arranged facing one another in a "periscope" arrangement (the mirrors 22 and 24 are "internal" with respect to the rotatable unit 30, differentiated from the mirrors 26 and 28 which are "external" with respect to the rotatable unit 30). The first mirror 22 and the second mirror 24 are thereby coupled together and have a fixed position relative to one another, with inwardly facing reflective surfaces that are substantially parallel to one another. The rotatable unit 30 (and hence the first and second mirrors 22 and 24 and the etalon 10 and filter 20) is rotatable in the direction shown by arrow 31.

With such an arrangement, and with the rotatable unit 30 appropriately positioned, light from the first external mirror 26 is reflected by the first internal mirror 22 towards the second internal mirror 24 which in turn reflects the light towards the second external mirror 28. Light is incident normal to the first and second external mirrors 26, 28. Because of the periscope arrangement of mirrors 22, 24 in the rotatable unit 30, the rotatable unit 30 can be referred to as a "periscope" unit.

It can be considered that the laser device 1 has first and second different arrangements of reflective elements. The first and second external mirrors 26, 28 make up the first arrangement of reflective elements, while the first and second internal mirrors 22, 24 make up the second arrangement of reflective elements (corresponding to the periscope unit 30). The reflective elements of the first and second arrangements together define the laser cavity of the laser device 1. The reflective elements of the second arrangement are arranged in optical series, to form a periscope-like arrangement, and (as will be explained below in more detail) provide a cavity tuning arrangement for adjusting the effective optical path length of the laser cavity.

Figure 7:
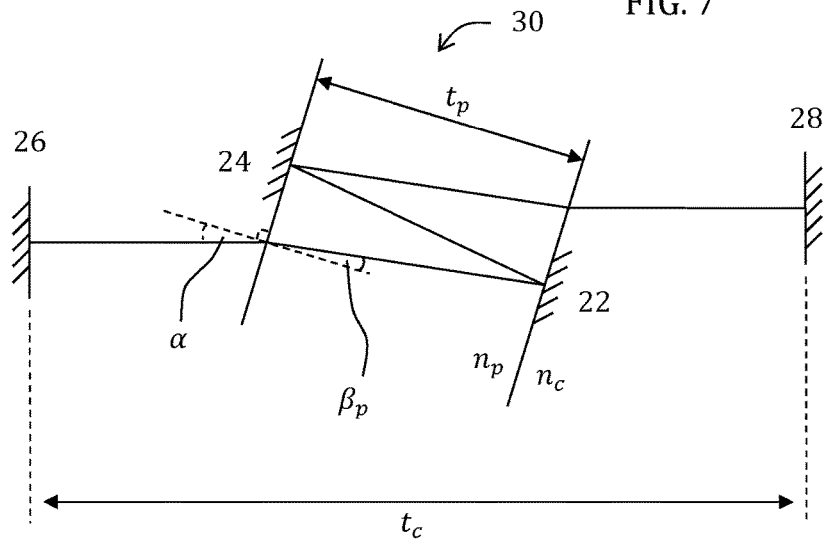
FIG. 7 is an alternative version of FIG. 6, with additional annotations which are used to derive the tuning response of the cavity tuning arrangement.

The optical path through the rotatable periscope unit 30 has the form illustrated in FIG. 7. For the sake of simplicity, the rotatable periscope unit 30 is illustrated in FIG. 7 as having an extent equal to a separation $t_p$ between the first and second internal mirrors 22, 24, with the unit 30 being filled with a medium having a refractive index of $n_p$. In the laser cavity 5 outside the unit 30, there is a medium of refractive index of $n_c$. This simplification is merely for the purpose of explanation, with the analysis being for a periscope unit 30 having periscope material between the planes of the first and second internal mirrors 22, 24 (e.g. where the periscope unit 30 is made from a single piece of transparent material having reflective areas to form the mirrors 22, 24). The analysis for an alternative arrangement in which the extent of the periscope material is not coincident with the planes of the first and second internal mirrors 22, 24 would be a simple extension that would be readily derivable by the skilled person and which does not affect the principles underlying the present invention. As will be seen below, in one implementation the periscope unit 30 is anyway filled with air, so that the material is the same both inside and outside the unit 30 ($n_p = n_c$).

Figure 8:
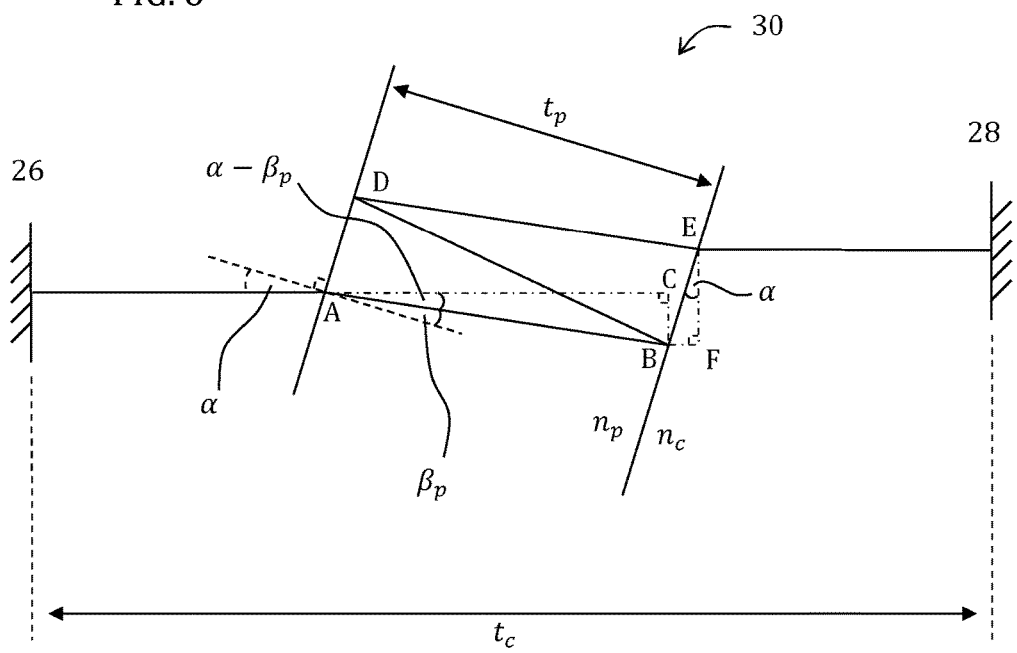
FIG. 8 is another alternative version of FIG. 6, with additional annotations which are used to derive the tuning response of the cavity tuning arrangement.

For the purpose of deriving the optical path length through the rotatable periscope unit 30, FIG. 7 is re-presented as FIG. 8, with some additional annotations included. Referring to FIG. 8, the optical path length through the rotatable periscope unit 30 can be written as the sum of the optical path length outside the unit 30 and the optical path length inside the unit 30:

$$\text{path} = n_c(t_c - (AC + BF)) + n_p(AB + BD + DE)$$

Since $AB = BD = DE$, the above can be expressed as:

$$\text{path} = n_c t_c - n_c(AC + BF) + 3n_p(AB)$$

From basic trigonometry and optics it is known that:

$$BF = BE \sin\alpha$$

$$BE = 2DE \sin\beta_p$$

$$DE = AB$$

$$\sin\alpha = \frac{n_p}{n_c} \sin\beta_p \text{ (Snell's Law)}$$

Therefore:

$$BF = 2AB \frac{n_p}{n_c} \sin^2\beta_p$$

An expression for AC can be derived as follows:

$$AC = AB \cos(\alpha - \beta_p)$$
$$= AB(\cos\alpha\cos\beta_p + \sin\alpha\sin\beta_p)$$
$$= AB\left(\cos\alpha\cos\beta_p + \frac{n_p}{n_c}\sin^2\beta_p\right) \text{ (using Snell's Law)}$$

Therefore:

$$n_c(AC + BF) = AB(n_c \cos\alpha\cos\beta_p + 3n_p \sin^2\beta_p)$$

Putting this into the expression for the optical path gives:

$$\text{path} = n_c t_c - AB(n_c\cos\alpha\cos\beta_p + 3n_p\sin^2\beta_p) + 3n_p(AB)$$
$$= n_c t_c - AB(n_c\cos\alpha\cos\beta_p + 3n_p(1 - \cos^2\beta_p)) - 3n_p)$$
$$= n_c t_c - AB(n_c\cos\alpha\cos\beta_p - 3n_p\cos^2\beta_p)$$

From basic trigonometry it is known that:

$$AB = \frac{t_p}{\cos\beta_p}$$

Therefore the expression for the optical path through the rotatable periscope unit 30 becomes:

$$\text{path} = n_c t_c - \frac{t_p}{\cos\beta_p}(n_c\cos\alpha\cos\beta_p - 3n_p\cos^2\beta_p)$$
$$= n_c t_c - t_p(n_c\cos\alpha - 3n_p\cos\beta_p)$$
$$= n_c(t_c - t_p\cos\alpha) + 3n_p t_p \cos\beta_p$$

For a periscope unit 30 filled with the same material as the cavity, for example both filled with air, the following holds:

$$n_p = n_c$$

$$\beta_p = \alpha$$

In such a case, the expression for the optical path through the rotatable periscope unit 30 becomes:

$$\text{path} = n_c(t_c - t_p\cos\alpha) + 3n_c t_p \cos\alpha$$
$$= n_c(t_c + 2t_p\cos\alpha)$$

Therefore the effective cavity length $L_c$ is given by:

$$L_c = t_c + 2t_p \cos\alpha$$

When $t_c \ll 2t_p \cos\alpha$, this simplifies further to:

$$L_c \approx 2t_p \cos\alpha$$

The above approximation ($t_c \ll 2t_p \cos\alpha$) is readily realisable in practice, particularly with an air-filled periscope unit 30 (or where the periscope medium is the same as the cavity medium); this will be explored in more detail below.

With the periscope unit 30 in place, the cavity modes are again defined by the optical path difference Δ between consecutive passes of the cavity being equal to an integer number of wavelengths (similar to the definition of the etalon and periscope-free cavity modes above):

$$2n_c L_c = m_c \frac{c}{v_c}$$

which gives the following when using the approximate expression for the cavity length:

$$2n_c(2t_p\cos\alpha) \approx m_c \frac{c}{v_c}$$

This gives the following (approximated) expression for the cavity mode frequency $v_c$:

$$v_c \approx m_c \frac{c}{2n_c(2t_p\cos\alpha)}$$

Comparing the above expression for the air-filled periscope laser cavity modes with the previous expression for the etalon modes, it can be appreciated that:

$$v_c \propto \frac{1}{\cos\alpha} \text{ whereas } v_e \propto \frac{1}{\cos\beta_e}$$

Since the internal etalon angle $\beta_e = \alpha$ for an air-filled etalon 10 (or where the etalon medium is the same as the cavity medium), the mode tuning can be made to have substantially the same dependence on rotational angle α and single mode (i.e. mode hop free) laser operation can be achieved over a significant tuning range.

If either the etalon 10 or the periscope unit 30 contain a material of different index (and in view of the above approximation $t_c \ll 2t_p \cos \alpha$), it can be appreciated that the tuning match is only approximate but nonetheless such an arrangement still offers very good single mode (i.e. mode hop free) performance over a wide range due to the matched inverse cosine dependencies.

The arrangement of mirrors 22, 24 in the periscope unit 30 perform the function of a cavity tuning arrangement for adjusting the effective optical path length of the laser cavity to move the cavity modes in frequency, with a frequency of the selected cavity mode being selectively adjustable by a rotation of the cavity tuning arrangement.

Furthermore, when the cavity mode selector (etalon 10) and the cavity tuning arrangement (periscope unit 30) perform a simultaneous coordinated movement by co-rotating with one another, respective frequencies of the etalon mode 'k' (selection feature) and the cavity mode '0' (selected cavity mode) vary with substantially the same dependence on the angle of rotation, at least over a predetermined range of the rotational angle. By such an arrangement, frequency tuning of the laser device 1 is provided over at least that predetermined range in which mode hopping is suppressed.

The benefit of using a co-rotating periscope arrangement, compared to just a rotating etalon as for example disclosed in WO 2010/070272, will now be explored. In addition, the validity of the above-mentioned approximation will also be explored.

The cavity modes for an etalon-in-cavity arrangement, with just a rotating etalon (for example either being made of glass or having a thickness of glass either side of a gap filled with another medium), can be derived in a very similar way to the cavity modes for the periscope-in-cavity arrangement shown in FIG. 8.

Figure 9:
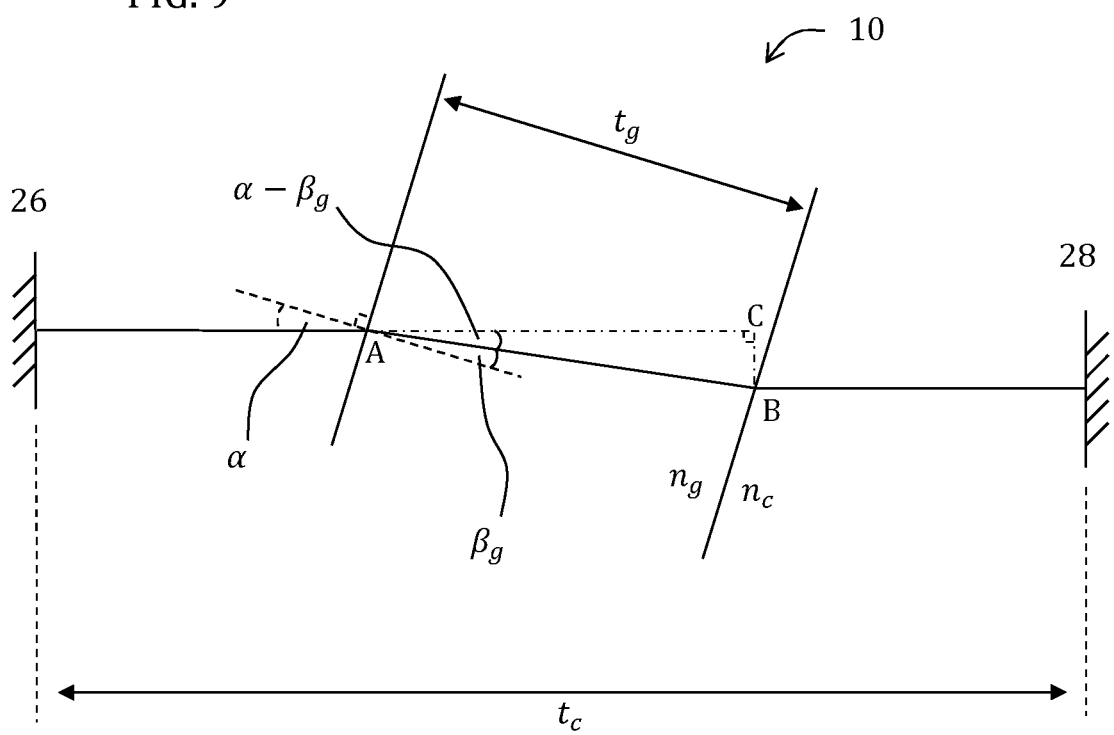
FIG. 9 is a schematic representation of a glass plate with additional annotations which are used to derive the cavity tuning effect of a rotating etalon.

With a glass plate, the BD, DE and BF segments of FIG. 8 do not feature in the analysis, with just the AB and AC segments being relevant. The optical path for a glass plate (representing the etalon 10) is illustrated in FIG. 9, with $n_g$ being the refractive index of the glass and $\beta_g$ being the internal angle within the glass.

The optical path is defined as follows:

$$\text{path} = n_c(t_c - AC) + n_g(AB)$$

From the previous analysis, it is already known that:

$$AC = AB\left(\cos\alpha\cos\beta_g + \frac{n_g}{n_c}\sin^2\beta_g\right)$$

$$AB = \frac{t_g}{\cos\beta_g}$$

Therefore:

$$\text{path} = n_c t_c - AB\left(n_c\left(\cos\alpha\cos\beta_g + \frac{n_g}{n_c}\sin^2\beta_g\right) - n_g\right)$$

$$= n_c t_c - \frac{t_g}{\cos\beta_g}(n_c\cos\alpha\cos\beta_g + n_g(1-\cos^2\beta_g) - n_g)$$

$$= n_c t_c - t_g(n_c\cos\alpha - n_g\cos\beta_g)$$

$$= n_c(t_c - t_g\cos\alpha) + n_g t_g \cos\beta_g$$

Compare the derived cavity optical paths for a periscope-in-cavity arrangement and an etalon-in-cavity arrangement:

periscope path=$n_c(t_c - t_p \cos\alpha) + 3n_p t_p \cos\beta_p$ etalon (glass plate) path=$n_c(t_c - t_g \cos\alpha) + n_g t_g \cos\beta_g$ It can be seen that these are very similar, differing in the multiple of the final term (nt cos β). Both paths have a dependence on both α and β. However, the key difference is that, with the periscope arrangement, α and β can be equalised by making the rotatable periscope unit 30 air-filled (or at least have the same material as the cavity, i.e. $n_p = n_c$). As seen above, the cosine term on the left cancels one of the three cosine terms on the right, reducing the periscope path to:

path=$n_c(t_c + 2t_p \cos\alpha)$

If the same were attempted with the etalon 10, the cosine terms would completely cancel one another, leaving just the $n_c t_c$ term and no dependence on rotation (naturally, since the glass has been replaced by air). With distinct and different refractive indices for the cavity and the etalon 10, the dependence on both α and β remains, so that there is not a pure inverse cosine dependence of the cavity mode frequency on rotational angle as there is for the periscope arrangement.

Furthermore, as mentioned above, with the periscope arrangement the additional approximation can be made that $t_c \ll 2t_p \cos \alpha$, reducing the path to an almost pure cosine dependency on α:

path≈$n_c 2t_p \cos\alpha$ and leaving an almost or substantially pure inverse cosine dependency to the cavity mode frequency $v_c$:

$$v_c \approx m_c \frac{c}{2n_c(2t_p\cos\alpha)}$$

Figure 10A:
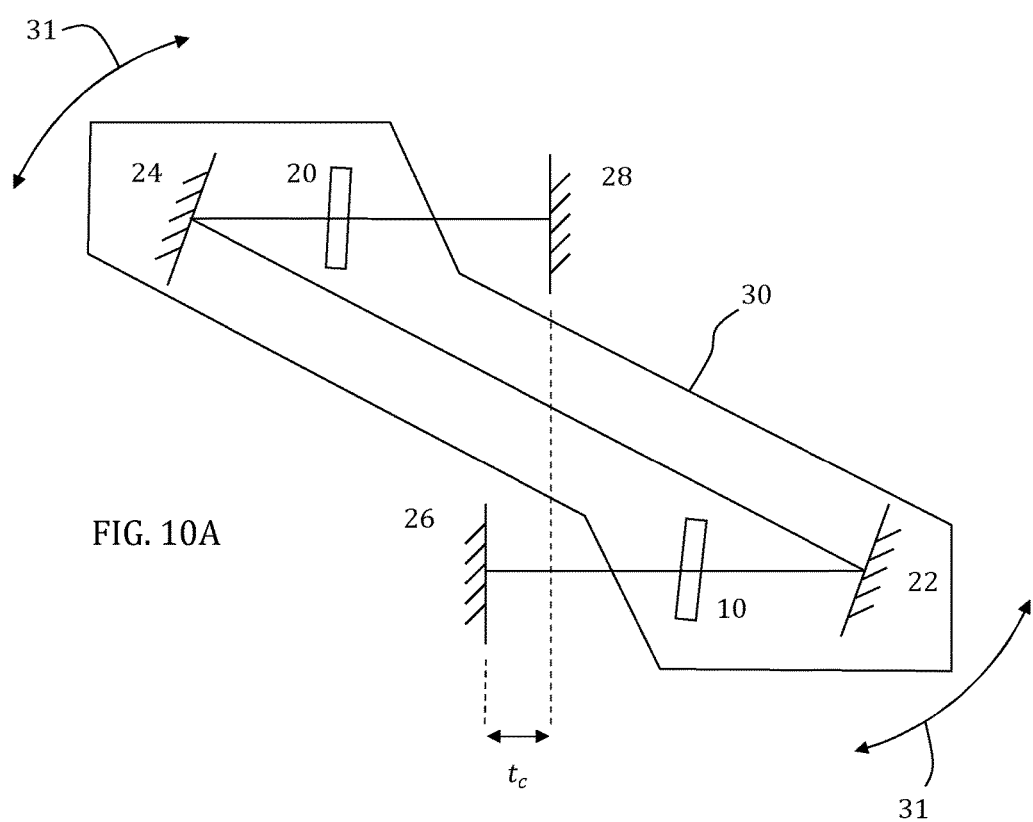
FIGS. 10A and 10B illustrate alternative periscope or cavity tuning arrangements to that illustrated in FIG. 6.

This approximation ($t_c \ll 2t_p \cos \alpha$) can readily be achieved in practice using an arrangement for the rotatable periscope unit 30 as illustrated in FIG. 10A. The cavity length $t_c$ can be made any value at all, for example zero. It could even be made negative. The cavity length $t_c$ is set by design to get the best tuning match of the periscope unit 30 to the etalon 10. For example, if the etalon 10 is solid glass but the periscope unit 30 is air-filled, a positive cavity length $t_c$ can achieve the best tuning range. If both are air filled, then cavity length $t_c = 0$ is best in principle but in practice something close to zero would be typical. Subject to glass thicknesses (such as collimating lens, filter substrate and glass substrate), optimal cavity length $t_c$ can actually be slightly negative.

Figure 10B:
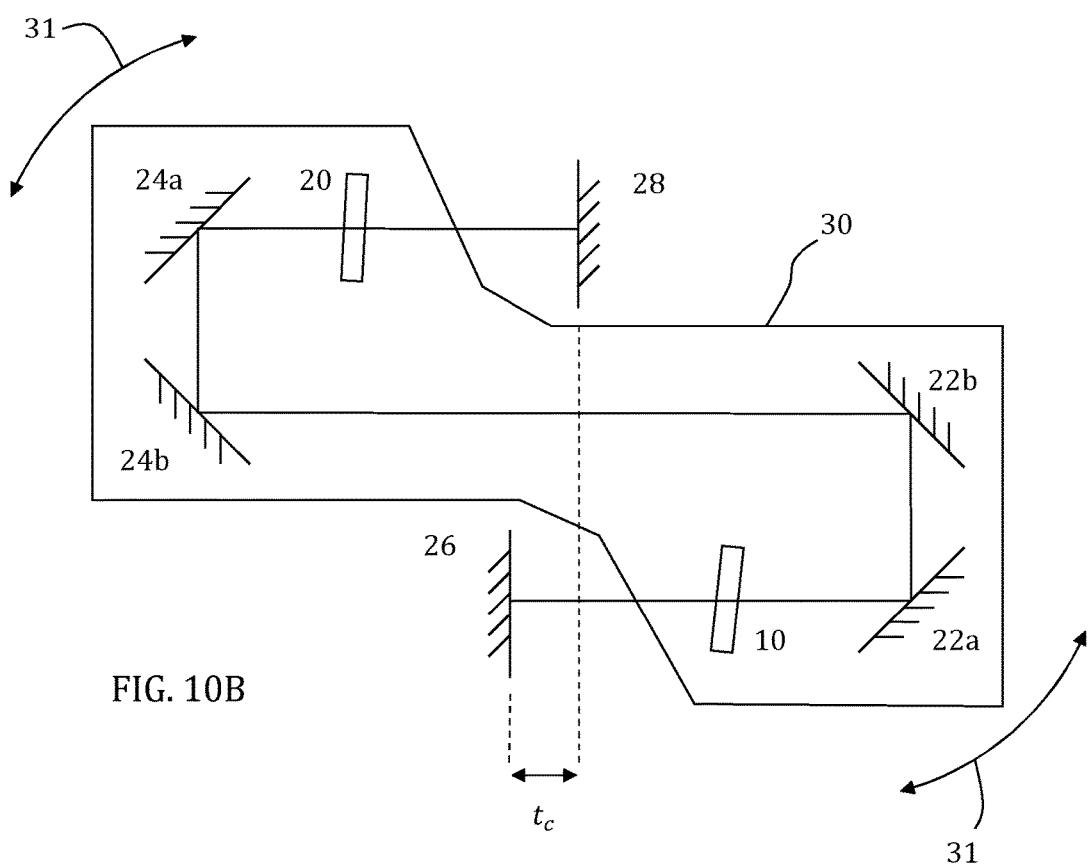

FIG. 10B shows a variation on FIG. 10A, having four mirrors 22a, 22b, 24a and 24b in the periscope unit 30 instead of two. The right-hand pair of adjacent mirrors 22a, 22b could be provided by a single component such as a retro-reflector (e.g. roof prism, cat's eye reflector or corner reflector), and similarly for the left-hand pair of adjacent mirrors 24a, 24b.

In summary, a key benefit of the rotatable periscope arrangement is a match (or at least a much closer approximation) to the etalon response, so that the cavity modes and etalon modes shift along the frequency axis in synchronisation, at the same rate, for a wider range (before any approximations begin to break down). An air-filled etalon 10 and air-filled periscope unit 30 with $t_c$ close to zero typically gives the best performance (potentially with a single-mode tuning range of several percent of the centre wavelength in practice). Even with a solid etalon and positive $t_c$ the tuning range is still improved (for example greater than 0.5% of the centre wavelength) over the previously-considered scheme of WO 2010/070272.

Figure 11:
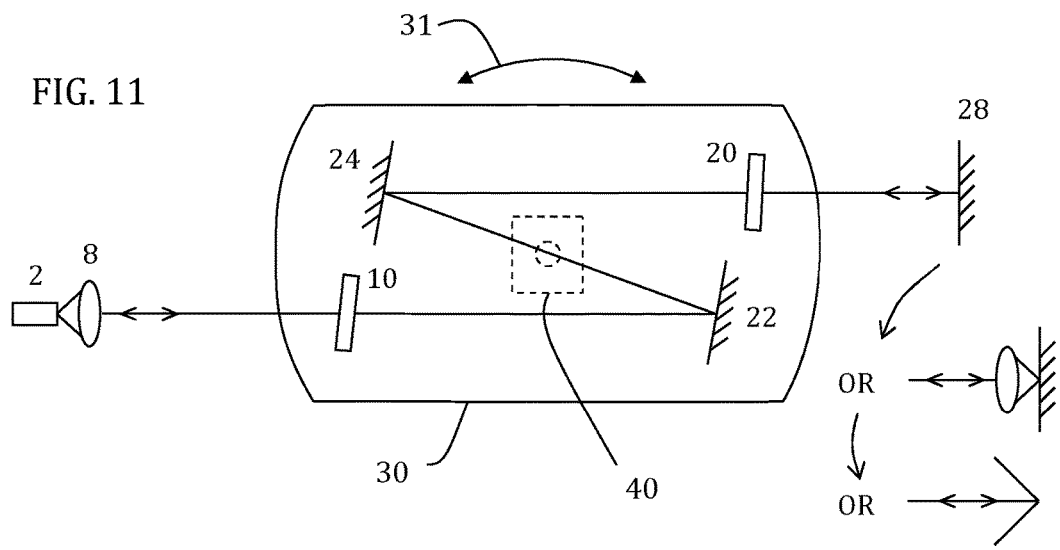
FIG. 11 illustrates schematically one practical arrangement of the scheme illustrated in FIG. 6, including possible enhancements to the end reflector of FIG. 6.

One practical arrangement of the scheme illustrated in FIG. 6 is shown in FIG. 11. FIG. 11 differs from the representation shown in FIG. 6 by showing the optical gain medium 2 and collimating lens 8 from FIG. 1, and by showing an actuator 40 which is configured to make the rotatable periscope unit 30 rotate in the direction shown by arrow 31. The actuator 40 would include all of the necessary motors and control electronics (not shown) to perform such a motion, the details of which would be readily apparent to the skilled person. For example, for rotational motion it is not essential to provide a motor which drives an axis, but the skilled person will readily understand that such motion may instead be achieved by one or more linear drives in combination with suitable couplings and pivots.

In this respect, it should also be noted that translation of the rotatable group or unit 30 has no effect on the tuning of the laser device 1, so that the scheme is robust against translation. Therefore, whatever mechanism is used to provide the rotational movement, the scheme would be insensitive to any translational movement introduced at the same time. This makes the scheme robust, and means that complicated motion control mechanisms are not required.

However, if the end mirror 28 does tilt, e.g. due to mechanical drift, the laser cavity could fall out of alignment. To overcome this problem, and to provide improved stability, it is desirable to replace the end mirror 28 with a retro-reflective component, such as a cat's eye reflector or a corner reflector as illustrated schematically in FIG. 11. A cat's eye reflector comprises a refractive optical element and a reflective surface, arranged so that the focal surface of the refractive element coincides with the reflective surface (typically a transparent sphere and a spherical mirror). A corner reflector comprises a set of three mutually perpendicular reflective surfaces, arranged as if to form the corner of a cube.

It will of course be appreciated that the etalon 10 and the filter 20 can be arranged at any point along the optical path within the rotatable unit 30, and need not be arranged where illustrated in FIGS. 6, 10 and 11. The etalon 10 and the filter 20 can each be placed individually and independently at any position along any one of the bottom, middle and top legs of the optical path through the rotatable unit 30. The etalon 10 and the filter 20 could even be arranged adjacent to one another along the same leg of the optical path. Indeed, the function of the etalon 10 and the filter 20 could be combined into a single component in some embodiments.

Dependent on the gain material used in the cavity, it may be advantageous to offset the periscope geometry slightly to compensate for material dispersion in order to maximise the available single mode operating range. As an alternative to introducing a geometric error, one might equally well introduce a compensating dispersive component into the cavity or adjust an operating parameter (such as diode injection current) to achieve the same.

Referring to the arrangement shown in FIG. 11, the present applicant has appreciated that lateral motion of the laser beam at the end reflector 28 due to the action of the periscope unit 30 can make a retro-reflector scheme difficult to implement to the high precision required in certain demanding applications. This problem can be overcome, to provide improved stability, with a modified scheme as illustrated in FIG. 12.

Figure 12:
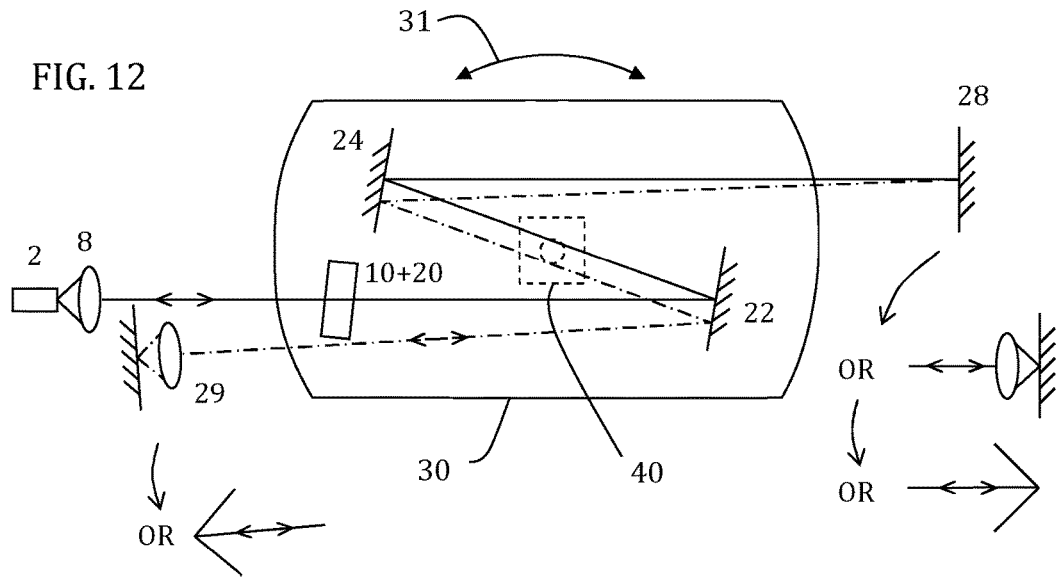
FIG. 12 is a schematic illustration of an advantageous modification of the FIG. 11 arrangement.

The scheme FIG. 12 is closely based on that shown in FIG. 11, with the key difference being that the laser beam is returned through the rotatable periscope unit 30, with an additional reflector 29 (which could be a retro-reflective component) to achieve this. The additional reflector 29 forms part of the first arrangement of reflective elements described above with reference to FIG. 6, and is in effect now the end reflector of the laser cavity (rather than reflector 28). In FIG. 12, the etalon 10 and filter 20 are shown as a single element, with the return beam not passing through the etalon 10 and filter 20 (though it could in another embodiment pass through one or both of these even if that is not required). Such an arrangement maintains the inverse cosine dependence of the selected cavity mode frequency on rotational angle, so that the above-described benefits of the periscope arrangement still apply.

Figure 13:
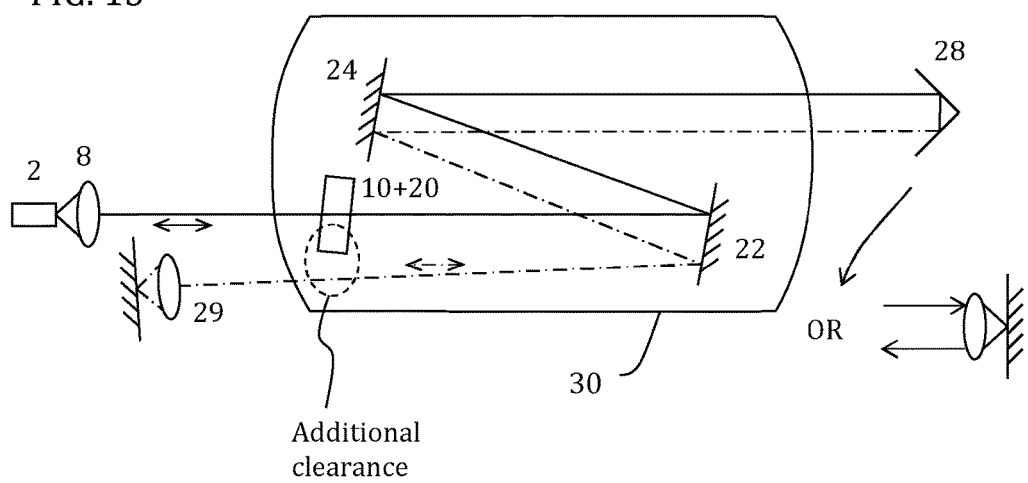
FIG. 13 is a variant of FIG. 12 showing the effect of using a lateral displacement component.

The reflector 28 could be replaced by a lateral displacement component (such as a roof prism, corner cube or lens/reflector) to ease the placement of components and to avoid beam clipping and compilation of incident angle through the etalon 10. This is illustrated in FIG. 13, which demonstrates that the use of a lateral displacement component as the reflector 28 has created more clearance between the component 10, 20 and the beam shown in dot-dashed line.

Although it is described above that the rotatable periscope unit 30 is made to rotate, what is important is the rotation of the unit 30 relative to other components. Therefore, it would instead be possible to keep the unit 30 stationary and rotate the other components, or to use a combination to achieve the relative rotation.

In the above-described embodiments, the etalon 10 performs the function of a cavity mode selector. However, the present invention is not limited to the use of an etalon as the cavity mode selector. In more generality, a cavity mode selector suitable for use with the present invention would have a frequency response with a selection feature (such as a mode peak of the etalon) that is alignable in frequency with a particular cavity mode so as to encourage that cavity mode to lase in preference to others. For example, the cavity mode selector could be a diffraction grating.

It will also be appreciated that the selection feature need not correspond to the precise point of a maximum in the frequency response, but can be considered to cover a finite range of frequencies which incorporate that maximum. Therefore, in the case of an etalon where the selection feature is a peak in the etalon mode gain, the selection feature need not be just the maximum itself. Rather, the "peak" or "selection feature" could extend either side of that maximum, for example to half the height of the peak or some other suitable definition of the extent of the peak. A "peak" in this context would be a feature of finite width, and would not necessary mean the point of the maximum.

Therefore, when it is stated herein that the selection feature is aligned with a cavity mode frequency, it is sufficient that any part of the selection feature, however defined, is aligned with the cavity mode frequency. In particular, it is not necessary in practice that the maximum of the peak of the selection feature is precisely aligned with the peak of the cavity mode, even if that may be preferable to achieve the best tuning performance. All that is required is that the selection feature, when aligned in frequency with the selected cavity mode, encourages that cavity mode to lase in preference to others.

Furthermore, although the above embodiment describes relative rotation of the components to achieve tuning of the laser device, it is conceivable that tuning could be effected by translation, or even combined rotation and translation. In general, a frequency of the selection feature of the cavity mode selector frequency profile should be selectively adjustable by a predetermined movement of the cavity mode selector.

Similarly, the periscope arrangement described above is just one example of a cavity tuning arrangement for adjusting the effective optical path length of the laser cavity to move the cavity modes in frequency, and tuning of the effective optical path length (in order to a selectively adjust a frequency of the selected cavity mode) could in general be effected by a predetermined movement of the cavity tuning arrangement, whether that be a rotation or a translation or a combined rotation and translation.

In the general case, an actuator would be configured to make the cavity mode selector and the cavity tuning arrangement perform a simultaneous coordinated movement, with respective frequencies of the selection feature and the selected cavity mode varying as a result of the simultaneous coordinated movement with substantially the same dependence on a parameter characterising the simultaneous coordinated movement, at least over a predetermined range of the parameter.

Therefore, the components need not be physically coupled to rotate together, but could for example be rotated independently—though in a coordinated fashion. For example, the components could be made to rotate independently with precisely the same changes in angular rotation, assuming the frequencies of the selection feature and the selected cavity mode have the same dependence on rotational angle. The parameter characterising the simultaneous coordinated movement is just the rotational angle in this case.

If the frequencies of the selection feature and the selected cavity mode do not have the same dependence on rotational angle, the movements would be coordinated accordingly. For example, the frequencies could have an equal but opposite dependence on rotational angle, in which case the components could be made to counter-rotate at the same rate. The parameter characterising the simultaneous coordinated movement could be the rotational angle of one of the components, since the rotational angle of the other is simply the negative of that.

Alternatively, one component might have an inverse cos $\theta$ dependence, whilst the other might have an inverse cos $2\theta$ dependence, in which case the second would be made to rotate at half the rate of the first. The parameter characterising the simultaneous coordinated movement could be defined as or considered to be the rotational angle of the first component, since the rotational angle of the other is simply twice that: just a single parameter ($\theta$) is required to characterise the simultaneous coordinated movement of both components.

Alternatively, one component might have an inverse cos $\alpha$ dependence, whilst the other might have an inverse cos $\beta$ dependence, in which case the second would be made to rotate at a different rate to the first, depending on the relationship between $\alpha$ and $\beta$. The parameter characterising the simultaneous coordinated movement could be defined as $\alpha$ or $\beta$ or some combination or function of the two.

Similar considerations apply in respect of the filter 20. For example, although with reference to FIG. 5 a broadband filter (such as a multi-layer filter) is described which has a single broad peak, there are other possibilities for the filter 20. In general, the filter should have a frequency response that (a) has a filter feature that is alignable in frequency with the selection feature of the cavity mode selector that is aligned with the selected cavity mode and (b) that combines with the frequency response of the cavity mode selector to produce a combined frequency response that encourages the selected cavity mode to lase in preference to others. Again, the filter feature would typically be a feature of finite width.

Figure 14:
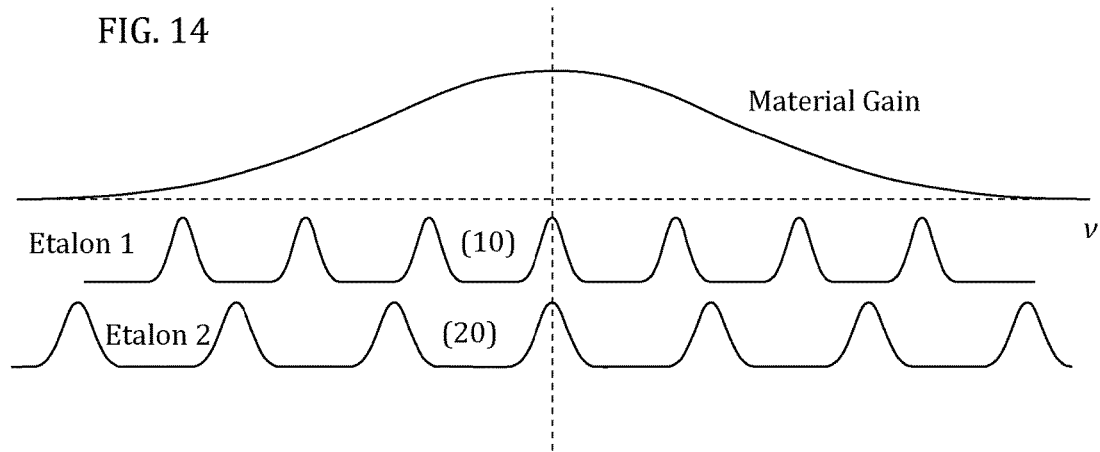
FIG. 14 illustrates an alternative to a broadband filter element in which an additional etalon is used in combination with the mode-selecting etalon.

For example, an alternative is to use a second co-rotating etalon as the filter 20, with the second etalon having a slightly different optical path $2n_eL_e$ to the mode-selecting etalon 10 such that only one pair of mode peaks coincide within the width of the laser material gain band, or at least such that any additional coinciding peaks occur at a material gain which is sufficiently suppressed not to have any realistic impact on the lasing mode. This is illustrated in FIG. 14. With such a scheme, the function of the etalon 10 and the filter 20 is effectively combined into a single component having a combined frequency response that encourages the selected cavity mode to lase in preference to others. It will also be appreciated that more than two etalons can be stacked in this way in order to fine tune the overall gain profile of the combined etalon 10 and filter 20 component, for example to obtain a sharper or more defined central peak or to provide better suppression of off-centre peaks.

In addition, the filter need not be physically coupled to the other components to move with them. The actuator would be configured to make two or more of the filter element, the cavity mode selector and the cavity tuning arrangement perform a simultaneous coordinated movement, with respective frequencies of the aligned selection feature, the filter feature and the selected cavity mode varying with substantially the same dependence on the parameter characterising the simultaneous coordinated movement, at least over the predetermined range of the parameter.

Figure 15:
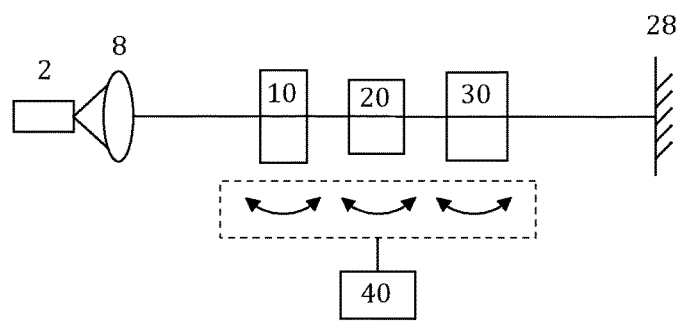
FIG. 15 is a generalised schematic illustration of a laser device according to an embodiment of the present invention.

In view of the above, an embodiment of the present is illustrated more generally (albeit schematically) in FIG. 15, showing a cavity mode selector 10, a cavity tuning arrangement 30 and a filter element 20 which are independently moveable, but which are made to perform a simultaneous coordinated movement by an actuator 40. The actuator 40 is configured to control the cavity mode selector 10, cavity tuning arrangement 30 and filter element 20 to perform a simultaneous coordinated movement, with respective characterising frequencies of the cavity mode selector 10, cavity tuning arrangement 30 and filter element 20 varying as a result of that simultaneous coordinated movement with substantially the same dependence on a parameter characterising the simultaneous coordinated movement, at least over a predetermined range of the parameter.

It will be appreciated that some advantage will still be obtained if the coordinated movement of one (but not two) of the cavity mode selector 10, cavity tuning arrangement 30 and filter element 20 is relaxed, or if one (but not two) of the cavity mode selector 10, cavity tuning arrangement 30 and filter element 20 does not have the same dependence on the parameter characterising the simultaneous coordinated movement. Doing so will for example mean that the single-mode tuning range will not be as wide as if all three components have the same dependence and are coordinated in movement. Therefore the present invention is intended to apply to any combination of two or more of the components 10, 20 and 30 illustrated in FIG. 15.

With independent control over the movements of each the components 10, 20 and 30, even if the underlying theoretical dependence is (for example) an inverse cosine dependence on rotation angle, where one or more of those components departs from that theoretical dependence (for example where an approximation begins to break down), the actuator can be configured to adjust the movements accordingly in order to restore the desired synchronisation.

The meaning of the phrase "periscope arrangement" of mirrors would be well understood by the skilled person, but for the avoidance of doubt can be understood to mean an arrangement in which a plurality of mirrors are arranged in optical series. By optical series is meant that each mirror in the series is arranged to direct light towards the next mirror in the series, if any (the final mirror in the series would direct the light away from the periscope arrangement, towards a mirror of the first arrangement described above). A mirror can be understood in this context as being or having a surface that is at least partially reflective, but is not intended to be limiting (for example, single a reflective element can be made up of any number of reflective surfaces, whether contiguous or not, and the reflective function can be provided e.g. by way of a grating). The more general term "reflective element" can therefore be used instead of "mirror". The mirrors of the periscope arrangement need not be parallel as illustrated in FIGS. 6 to 8 and 10 to 12. However, a non-parallel arrangement potentially loses the advantage described above of insensitivity of the cavity path to translation of the arrangement: translation of a non-parallel arrangement of mirrors may affect the cavity path. In addition, there may be more than the two mirrors as illustrated in FIGS. 6 to 8 and 10 to 12.

A selection of such alternative periscope arrangements is illustrated schematically in FIG. 16. Alternative (A) has parallel end mirrors and four parallel periscope mirrors making up the rotatable periscope unit 30. Alternative (B) has three parallel periscope mirrors making up the rotatable periscope unit 30, with two non-parallel end mirrors.

Alternative (C) has two non-parallel periscope mirrors making up the rotatable periscope unit 30, with two non-parallel end mirrors. Alternative (D) has three non-parallel periscope mirrors making up the rotatable periscope unit 30, with two non-parallel end mirrors. Alternative (E) has two periscopes, and is similar in some sense to the "double pass" (or "multiple pass") embodiment of FIG. 12 since the beam passes twice in each direction through the periscope unit 30 before returning to the end mirror associated with the gain medium 2 (e.g. the lower left mirror), albeit via a different periscope on each pass in the same direction. With the two periscopes of alternative (E), one increases and one reduces optical path, so provided that they have different $t_p$ values (or incident angles) there would be a net inverse cosine response. However, the beam on the return optic (ideally a retro-reflector) is only fully stationary in the symmetric case. It is noted that only alternative (A), having parallel end mirrors (and an even number of periscope mirrors) would demonstrate insensitivity of the cavity path to translation of the arrangement 30. Alternative (F) illustrates what is effectively a more direct variant of the "double pass" (or "multiple pass") embodiment of FIG. 12, with the two mirrors within the upper dotted outline corresponding to mirror 22 of FIG. 12, and with the two mirrors within the lower dotted outline corresponding to mirror 24 of FIG. 12. This illustrates that more than one mirror or reflective surface can be considered to make up a reflective element of the periscope arrangement 30.

In each of the examples described with reference to FIG. 16, and in the earlier-illustrated embodiments, the frequency tuneable laser device comprises first and second arrangements of reflective elements. The reflective elements of the first and second arrangements together define the laser cavity of the laser device. The laser cavity provides a plurality of cavity modes at which the laser device is capable of lasing, with each cavity mode having a different respective mode frequency. The reflective elements of the second arrangement provide the cavity tuning arrangement for adjusting the effective optical path length of the laser cavity to move the cavity modes in frequency. The reflective elements of the cavity tuning arrangement are arranged in optical series. The effective optical path length of the laser cavity is selectively adjustable by a predetermined movement of the cavity tuning arrangement, such as a rotation about a particular degree of freedom.

In addition, for the "double pass" (or "multiple pass") examples, the reflective elements of the first arrangement are arranged to define an optical path for the laser cavity which passes at least twice in each direction through the series of reflective elements of the cavity tuning arrangement before returning to the same reflective element of the first arrangement. For example, referring to FIG. 12, the optical path passes through the reflective elements 22, 24 of the cavity tuning arrangement 30 in a first direction or order (22 then 24), then in the opposite direction or order (24 then 22), then again in the first direction or order (22 then 24), and then again in the opposite direction or order (24 then 22), before returning to the same reflective element of the first arrangement (i.e. the rear face 6 of the optical gain medium 2 (see FIG. 1). It can be seen that the rear face 6 of the optical gain medium 2 forms one of the reflective element of the first arrangement.

It is stated above that the cavity mode selector has a frequency response which is configured to encourage the selected cavity mode to lase in preference to others. It is to be appreciated that in practice it is the frequency response of the cavity mode selector combined with the frequency response of any other elements of the device that ultimately determines which of the cavity modes will lase. For example, it is possible that the cavity mode selector has a frequency response that would not of itself necessarily result in a single dominant cavity mode, but it may combine with a fixed (non-rotating or non-moving) optical component having a frequency response which addresses that in order to provide a single dominant cavity mode. It is sufficient that the cavity mode selector acts to encourage the selected cavity mode to lase in preference to other cavity modes (i.e. in preference to at least some, not necessarily all, other cavity modes). In other words, the selection feature of the frequency profile is not necessarily absolute in producing a single cavity mode, but may rely on other components (including the natural gain profile of the laser medium) to refine the selection or to provide a more certain dominant mode.

Indeed, the cavity mode selector may have more than one such selection feature, which may be of substantially equal prominence in the frequency response of the cavity mode selector: an example of such a cavity mode selector is the etalon 10, and it is explained above that with such a cavity mode selector it is preferable to provide a filter combines with the etalon to produce the desired response. In previously-considered arrangements the filter was stationary, whereas it is proposed herein that the filter can co-rotate with the etalon for improved performance.

The invention claimed is:

1. A frequency tuneable laser device comprising a laser cavity defining a plurality of cavity modes at which the laser device is capable of lasing, each cavity mode having a different respective mode frequency, with the laser cavity comprising:

a cavity mode selector having a frequency response with a selection feature that is alignable in frequency with a cavity mode of the plurality to encourage that cavity mode, denoted as the selected cavity mode, to lase in preference to others, with a frequency of the selection feature being selectively adjustable by a predetermined movement of the cavity mode selector; and a cavity tuning arrangement for adjusting the effective optical path length of the laser cavity to move the cavity modes in frequency, with a frequency of the selected cavity mode being selectively adjustable by a predetermined movement of the cavity tuning arrangement, wherein the cavity tuning arrangement comprises a plurality of reflective elements arranged in optical series;

and the laser device further comprising:

an actuator configured to make the cavity mode selector and the cavity tuning arrangement perform a simultaneous coordinated movement, with respective frequencies of the selection feature and the selected cavity mode varying as a result with substantially the same dependence on a parameter characterising the simultaneous coordinated movement, at least over a predetermined range of the parameter, wherein the frequency response of the cavity mode selector has a plurality of such selection features, each of which could potentially encourage a cavity mode to lase in preference to others, and only one of which selection features is aligned in frequency with the selected cavity mode, wherein the laser device further comprises a filter element which has a frequency response that (a) has a filter feature that is alignable in frequency with the selection feature of the cavity mode selector that is aligned with the selected cavity mode and (b) combines with the frequency response of the cavity mode selector to produce a combined frequency response that encourages the selected cavity mode to lase in preference to others, wherein the actuator is configured to make the filter element, the cavity mode selector and the cavity tuning arrangement perform a simultaneous coordinated movement, with respective frequencies of the aligned selection feature, the filter feature and the selected cavity mode varying with substantially the same dependence on the parameter characterising the simultaneous coordinated movement, at least over the predetermined range of the parameter.

2. A frequency tuneable laser device comprising a laser cavity defining a plurality of cavity modes at which the laser device is capable of lasing, each cavity mode having a different respective mode frequency, with the laser cavity comprising:

a cavity mode selector having a frequency response with a selection feature that is alignable in frequency with a cavity mode of the plurality to encourage that cavity mode, denoted as the selected cavity mode, to lase in preference to others, with a frequency of the selection feature being selectively adjustable by a predetermined movement of the cavity mode selector;

wherein the frequency response of the cavity mode selector has a plurality of such selection features, each of which could potentially encourage a cavity mode to lase in preference to others, and only one of which selection features is aligned in frequency with the selected cavity mode, wherein the laser device further comprises a filter element which has a frequency response that (a) has a filter feature that is alignable in frequency with the selection feature of the cavity mode selector that is aligned with the selected cavity mode and (b) combines with the frequency response of the cavity mode selector to produce a combined frequency response that encourages the selected cavity mode to lase in preference to others;

and the laser device further comprising:

an actuator configured to make the cavity mode selector and the filter element perform a simultaneous coordinated movement, with respective frequencies of the aligned selection feature and the filter feature varying as a result with substantially the same dependence on a parameter characterising the simultaneous coordinated movement, at least over a predetermined range of the parameter.

3. A laser device as claimed in claim 1, wherein the filter element is formed from a plurality of etalons arranged in series with each etalon of the plurality having a different etalon mode spacing.

4. A laser device as claimed in claim 1, wherein parts performing the simultaneous coordinated movement are mechanically coupled to one another by a coupling which maintains the parts in a fixed relationship relative to one another, with the actuator being configured to move the coupled parts together as a group.

5. A laser device as claimed in claim 1, wherein the simultaneous coordinated movement is a relative rotational movement of each part performing the simultaneous coordinated movement, and wherein the parameter characterising the simultaneous coordinated movement is a rotational angle associated with the relative rotational movement.

6. A laser device as claimed in claim 5, wherein the simultaneous coordinated movement is a relative rotational movement of each part performing the simultaneous coordinated movement by the same amount.

7. A laser device as claimed in claim 5, wherein the dependence is an inverse cosine dependence on the rotational angle.

8. A laser device as claimed in claim 1, wherein the cavity mode selector comprises a diffraction grating.

9. A laser device as claimed in claim 1, wherein the cavity mode selector comprises an etalon having opposed partially reflective surfaces defining a plurality of etalon modes, with the or each selection feature being or relating to a respective etalon mode.

10. A laser device as claimed in claim 9, wherein the filter element is formed from a plurality of etalons arranged in series with each etalon of the plurality having a different etalon mode spacing, wherein the cavity mode selector and the filter element share an etalon in common.

11. A laser device as claimed in claim 9, wherein a medium provided in a space between the reflective elements of the cavity tuning arrangement has substantially the same refractive index as a medium provided in a space between the reflective surfaces of the cavity mode selector etalon.

12. A laser device as claimed in claim 1, comprising first and second arrangements of reflective elements, with the reflective elements of the first and second arrangements defining the laser cavity of the laser device, and the reflective elements of the second arrangement being the reflective elements of the cavity tuning arrangement.

13. A laser device as claimed in claim 12, wherein the reflective elements of the first arrangement are arranged to define an optical path for the laser cavity which passes at least twice in each direction through the series of reflective elements of the cavity tuning arrangement before returning to the same reflective element of the first arrangement.

14. A frequency tuneable laser device comprising first and second arrangements of reflective elements defining a laser cavity of the laser device, the laser cavity providing a plurality of cavity modes at which the laser device is capable of lasing, with each cavity mode having a different respective mode frequency, wherein the reflective elements of the second arrangement provide a cavity tuning arrangement for adjusting the effective optical path length of the laser cavity to move the cavity modes in frequency, wherein the reflective elements of the cavity tuning arrangement are arranged in optical series, wherein the effective optical path length of the laser cavity is selectively adjustable by a predetermined movement of the cavity tuning arrangement, and wherein the reflective elements of the first arrangement are arranged to define an optical path for the laser cavity which passes at least twice in each direction through the series of reflective elements of the cavity tuning arrangement before returning to the same reflective element of the first arrangement.

15. A laser device as claimed in claim 13, wherein the first arrangement comprises an odd number of reflective elements.

16. A laser device as claimed in claim 12, wherein at least one of the reflective elements of the first arrangement is a retro-reflective component.

17. A laser device as claimed in claim 12, wherein at least one of the reflective elements of the first arrangement is a lateral displacement component.

18. A laser device as claimed in claim 12, wherein a separation between a pair of reflective elements of the first arrangement is arranged to be smaller than twice a separation between a pair of reflective elements of the cavity tuning arrangement.

19. A laser device as claimed in claim 1, wherein at least two of the reflective elements of the cavity tuning arrangement are substantially parallel with one another.

20. A laser device as claimed in claim 1, wherein the cavity tuning arrangement comprises an even number of reflective elements.

21. A laser device as claimed in claim 2, wherein parts performing the simultaneous coordinated movement are mechanically coupled to one another by a coupling which maintains the parts in a fixed relationship relative to one another, with the actuator being configured to move the coupled parts together as a group.

22. A laser device as claimed in claim 2, wherein the simultaneous coordinated movement is a relative rotational movement of each parts performing the simultaneous coordinated movement, and wherein the parameter characterising the simultaneous coordinated movement is a rotational angle associated with the relative rotational movement.

23. A laser device as claimed in claim 2, wherein the cavity mode selector comprises an etalon having opposed partially reflective surfaces defining a plurality of etalon modes, with the or each selection feature being or relating to a respective etalon mode.

24. A laser device as claimed in claim 23, wherein the filter element is formed from a plurality of etalons arranged in series with each etalon of the plurality having a different etalon mode spacing, wherein the cavity mode selector and the filter element share an etalon in common.

25. A frequency tuneable laser device comprising a laser cavity defining a plurality of cavity modes at which the laser device is capable of lasing, each cavity mode having a different respective mode frequency, with the laser cavity comprising:
a cavity mode selector having a frequency response with a selection feature that is alignable in frequency with a cavity mode of the plurality to encourage that cavity mode, denoted as the selected cavity mode, to lase in preference to others, with a frequency of the selection feature being selectively adjustable by a predetermined movement of the cavity mode selector; and
a cavity tuning arrangement for adjusting the effective optical path length of the laser cavity to move the cavity modes in frequency, with a frequency of the selected cavity mode being selectively adjustable by a predetermined movement of the cavity tuning arrangement, wherein the cavity tuning arrangement comprises a plurality of reflective elements arranged in optical series;
and the laser device further comprising:
an actuator configured to make the cavity mode selector and the cavity tuning arrangement perform a simultaneous coordinated movement, with respective frequencies of the selection feature and the selected cavity mode varying as a result with substantially the same dependence on a parameter characterising the simultaneous coordinated movement, at least over a predetermined range of the parameter,
wherein the cavity mode selector comprises a diffraction grating.

26. A frequency tuneable laser device comprising a laser cavity defining a plurality of cavity modes at which the laser device is capable of lasing, each cavity mode having a different respective mode frequency, with the laser cavity comprising:
a cavity mode selector having a frequency response with a selection feature that is alignable in frequency with a cavity mode of the plurality to encourage that cavity mode, denoted as the selected cavity mode, to lase in preference to others, with a frequency of the selection feature being selectively adjustable by a predetermined movement of the cavity mode selector;
a cavity tuning arrangement for adjusting the effective optical path length of the laser cavity to move the cavity modes in frequency, with a frequency of the selected cavity mode being selectively adjustable by a predetermined movement of the cavity tuning arrangement, wherein the cavity tuning arrangement comprises a plurality of reflective elements arranged in optical series; and
first and second arrangements of reflective elements, with the reflective elements of the first and second arrangements defining the laser cavity of the laser device, and the reflective elements of the second arrangement being the reflective elements of the cavity tuning arrangement;
and the laser device further comprising:
an actuator configured to make the cavity mode selector and the cavity tuning arrangement perform a simultaneous coordinated movement, with respective frequencies of the selection feature and the selected cavity mode varying as a result with substantially the same dependence on a parameter characterising the simultaneous coordinated movement, at least over a predetermined range of the parameter,
wherein a separation between a pair of reflective elements of the first arrangement is arranged to be smaller than twice a separation between a pair of reflective elements of the cavity tuning arrangement.

27. A frequency tuneable laser device comprising a laser cavity defining a plurality of cavity modes at which the laser device is capable of lasing, each cavity mode having a different respective mode frequency, with the laser cavity comprising:
a cavity mode selector having a frequency response with a selection feature that is alignable in frequency with a cavity mode of the plurality to encourage that cavity mode, denoted as the selected cavity mode, to lase in preference to others, with a frequency of the selection feature being selectively adjustable by a predetermined movement of the cavity mode selector; and
a cavity tuning arrangement for adjusting the effective optical path length of the laser cavity to move the cavity modes in frequency, with a frequency of the selected cavity mode being selectively adjustable by a predetermined movement of the cavity tuning arrangement, wherein the cavity tuning arrangement comprises a plurality of reflective elements arranged in optical series;

and the laser device further comprising:

an actuator configured to make the cavity mode selector and the cavity tuning arrangement perform a simultaneous coordinated movement, with respective frequencies of the selection feature and the selected cavity mode varying as a result with substantially the same dependence on a parameter characterising the simultaneous coordinated movement, at least over a predetermined range of the parameter, wherein at least two of the reflective elements of the cavity tuning arrangement are substantially parallel with one another.

* * * * *